US012080051B1

United States Patent
Kanagaraj et al.

(10) Patent No.: US 12,080,051 B1
(45) Date of Patent: Sep. 3, 2024

(54) CAMERA APPARATUS AND METHOD OF DETECTING CROP PLANTS IRRESPECTIVE OF CROP IMAGE DATA VARIATIONS

(71) Applicant: Tartan Aerial Sense Tech Private Limited, Bangalore (IN)

(72) Inventors: Dhivakar Kanagaraj, Karur (IN); Pranav M P, Bengaluru (IN); Raghul Raghu, Madurai (IN); Parth Gupta, New Delhi (IN); Vijay Sundaram, Tamil Nadu (IN)

(73) Assignee: Tartan Aerial Sense Tech Private Limited, Bangalore (IN)

( * ) Notice: Subject to any disclaimer, the term of this patent is extended or adjusted under 35 U.S.C. 154(b) by 0 days.

(21) Appl. No.: 18/582,148

(22) Filed: Feb. 20, 2024

(30) Foreign Application Priority Data

Oct. 19, 2023 (IN) .............................. 202341071593

(51) Int. Cl.
*G06V 10/774* (2022.01)
*G06V 10/26* (2022.01)
(Continued)

(52) U.S. Cl.
CPC ............ *G06V 10/774* (2022.01); *G06V 10/26* (2022.01); *G06V 10/30* (2022.01); *G06V 10/764* (2022.01);
(Continued)

(58) Field of Classification Search
CPC ...... G06V 10/774; G06V 10/82; G06V 10/30; G06V 20/188; G06V 10/26; G06V 10/776; G06V 10/764
See application file for complete search history.

(56) References Cited

U.S. PATENT DOCUMENTS 10,223,588 B2 * 3/2019 Wilson .................. G06V 20/38
11,553,636 B1 * 1/2023 Palomares ........... G06V 10/764
(Continued)

OTHER PUBLICATIONS

Saini, Rashmi, and Sanjay Kumar Ghosh. "Crop classification in a heterogeneous agricultural environment using ensemble classifiers and single-date Sentinel-2A imagery." Geocarto international 36.19 (2021): 2141-2159. (Year: 2021).*

(Continued)

*Primary Examiner* — Utpal D Shah
(74) *Attorney, Agent, or Firm* — Barta Jones, PLLC

(57) ABSTRACT

A camera apparatus includes one or more processors configured to determine a plurality of crop image data variation classifications representative of real-world variations in physical appearance of a crop plant as well as a surrounding area around the crop plant. Furthermore, select a first set of input color images from first training dataset comprising a plurality of different field-of-views (FOVs). Thereafter, execute plurality of different image level augmentation operations to obtain an augmented set of color images, identify and filter noisy images from a second training dataset based on a predefined set of image parameters. After that, train neural network model in a first stage on a third training dataset, re-determine new crop image data variation classifications and re-select new color images representative of the new crop image data variation classifications to further train the neural network model in a second stage to detect one or more crop plants.

20 Claims, 15 Drawing Sheets

(51) Int. Cl.
  *G06V 10/30* (2022.01)
  *G06V 10/764* (2022.01)
  *G06V 10/776* (2022.01)
  *G06V 10/82* (2022.01)
  *G06V 20/10* (2022.01)

(52) U.S. Cl.
  CPC ............ *G06V 10/776* (2022.01); *G06V 10/82* (2022.01); *G06V 20/188* (2022.01)

(56) References Cited

U.S. PATENT DOCUMENTS

| | | | |
|---|---|---|---|
| 2019/0005358 A1* | 1/2019 | Pisoni | G06V 10/82 |
| 2020/0279374 A1* | 9/2020 | King | G06V 10/50 |
| 2020/0401850 A1* | 12/2020 | Bazarsky | G06V 10/774 |
| 2021/0092891 A1* | 4/2021 | Grant | G05D 1/0246 |
| 2022/0327815 A1* | 10/2022 | Picon Ruiz | G06T 7/001 |
| 2022/0415022 A1* | 12/2022 | Brumby | G06V 20/194 |
| 2023/0059768 A1* | 2/2023 | Schler | G06V 10/40 |
| 2023/0221239 A1* | 7/2023 | Praljak | G06V 10/764 |
| | | | 382/134 |
| 2023/0292647 A1* | 9/2023 | Bainbridge | G06V 20/188 |
| | | | 702/2 |
| 2024/0057505 A1* | 2/2024 | Liu | A01B 79/005 |

OTHER PUBLICATIONS

Nowakowski, Artur, et al. "Crop type mapping by using transfer learning." International Journal of Applied Earth Observation and Geoinformation 98 (2021): 102313. (Year: 2021).*

Gu, Shanqing, Manisha Pednekar, and Robert Slater. "Improve image classification using data augmentation and neural networks." SMU Data Science Review 2.2 (2019): 1. (Year: 2018).*

* cited by examiner

CAMERA APPARATUS AND METHOD OF DETECTING CROP PLANTS IRRESPECTIVE OF CROP IMAGE DATA VARIATIONS

CROSS-REFERENCE TO RELATED APPLICATIONS/INCORPORATION BY REFERENCE

This Patent Application makes reference to, claims the benefit of, and claims priority to an Indian Provisional Patent Application No. 202341071593, filed on Oct. 19, 2023, which is incorporated herein by reference in its entirely, and for which priority is hereby claimed under the Paris Convention and 35 U.S.C. 119 and all other applicable law.

The above-referenced application is hereby incorporated herein by reference in its entirety.

FIELD OF TECHNOLOGY

Certain embodiments of the disclosure relate to camera-driven agricultural machines. More specifically, certain embodiments of the disclosure relate to a camera apparatus, and a method of detecting crop plants irrespective of crop image data variations.

BACKGROUND

With the rapid advancement of machines, agricultural implements, special-purpose vehicles, and vehicle-mounted apparatus, productivity in agricultural operations has increased. Modern agronomy makes use of the best technological devices and techniques to increase the yield. Crop detection using a camera plays a crucial role in camera-driven agricultural solutions due to its significant impact on farm upkeep and automation.

In certain scenarios, neural network models may be trained for the purpose of crop detection. Typically, these neural networks are heavily reliant on a lot of training data to avoid overfitting and poor model performance. Unfortunately, in many cases such as real-world agricultural applications, there is limited data available, and gathering enough training data is very challenging and expensive. One of the most difficult challenges is the generalizability of deep learning models that describe the performance difference of a model when evaluated on previously seen data (training data) versus data it has never seen before (testing data). Models with poor generalizability have overfitted the training data (Overfitting problem). To build useful neural network models, data augmentation is a very powerful method to reduce overfitting by providing a more comprehensive set of possible data points to minimize the distance between the training and testing sets. However, the detection of plants using a camera can be technically challenging due to various factors, including variations in crop data and seasonal changes in real-world agricultural environment.

In an example, conventional camera-driven solutions are erroneous in the detection of crop plants in a real-time application hindering the accuracy and efficacy of these camera systems. Unlike controlled settings, agricultural fields are often uneven, with varying terrain, obstacles, and clutter, which makes it difficult to capture artifact-free images. In another example, conventional cameras are often calibrated for standard environments, making them less effective in the unique conditions of agricultural fields. This can lead to issues with color accuracy, perspective distortion, and image clarity. Examples of the unique conditions of agricultural fields include but are not limited to: a) the sunlight variation issue, i.e., sunlight constantly changes throughout the day, causing shadows, reflections, and variations in brightness; b) the mist issue, created by spraying of chemicals on agricultural fields causing a rainbow-like phenomenon in the camera field-of-view; c) shadow-on-plant problem and d) lighting-induced color shifts. Thus, applying conventional image processing methods and neural network training methods mostly fails in agricultural applications, which in turn reduces the effectiveness of neural network model training (trained on conventionally augmented training data and training methods) resulting in an increase in the false negatives and false positives detection, thereby adversely affecting the accuracy and reliability of the conventional system.

Further limitations and disadvantages of conventional and traditional approaches will become apparent to one of skill in the art through comparison of such systems with some aspects of the present disclosure as set forth in the remainder of the present application with reference to the drawings.

BRIEF SUMMARY OF THE DISCLOSURE

A camera apparatus and a method of detecting crop plants irrespective of crop image data variations, substantially as shown in and/or described in connection with at least one of the figures, as set forth more completely in the claims.

These and other advantages, aspects, and novel features of the present disclosure, as well as details of an illustrated embodiment thereof, will be more fully understood from the following description and drawings.

BRIEF DESCRIPTION OF DRAWINGS

Embodiments of the present disclosure will now be described, by way of example only, with reference to the following diagrams wherein.

DETAILED DESCRIPTION OF THE DISCLOSURE

Certain embodiments of the disclosure may be found in a camera apparatus, and a method of detecting crop plants irrespective of crop image data variations (i.e., any real-world variations in physical appearance of crop plants including season induced variations).

The camera apparatus and method of the present disclosure solves various technical challenges in camera-based crop detection systems so that the camera apparatus is effective in detecting crop plants with improved accuracy even in the unique conditions of agricultural fields. The camera apparatus (or the training server) determines a plurality of crop image data variation classifications representative of real-world variations in the physical appearance of a crop plant as well as a surrounding area around the crop plant. The determination of crop image data variation classifications allows for the selection of diverse input color images from a training dataset, capturing real-world variations in crop plant appearances and their surrounding areas. Through the execution of various image-level augmentation operations and subsequent identification and filtering of noisy images, the camera apparatus mitigates issues related to limited training data and challenges in real-time agricultural settings. The two-stage training process, involving an initial training on a noise-filtered dataset and subsequent refinement with new color images, ensures improved generalizability and accuracy of the neural network model. This camera apparatus offers a comprehensive solution to the complexities of crop detection in dynamic and challenging agricultural environments. The disclosed camera apparatus (or a training server) introduces a technically advanced approach to training a neural network model in two stages for crop detection based on images captured in an agricultural environment in a real time or near real time.

In the following description, reference is made to the accompanying drawings, which form a part hereof, and which is shown, by way of illustration, various embodiments of the present disclosure.

Figure 1:
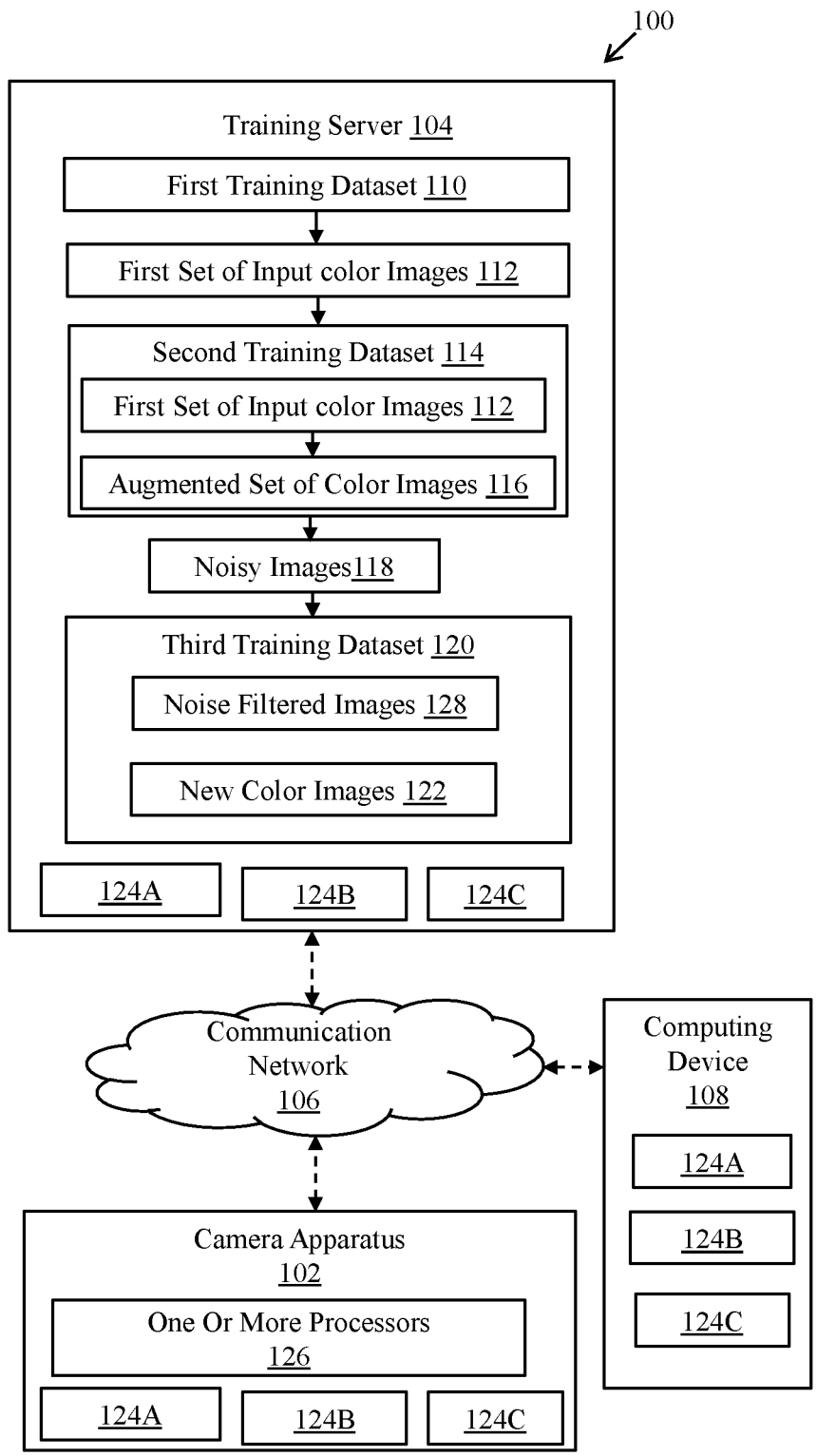
FIG. 1 is a network environment diagram of a camera apparatus with a training server, in accordance with an embodiment of the present disclosure.

FIG. 1 is a network environment diagram of a camera apparatus, in accordance with an embodiment of the present disclosure. With reference to FIG. 1, there is shown a network diagram 100 of a camera apparatus 102. The camera apparatus 102 may include a training server 104, a computing device 108, and a communication network 106. The training server 104 includes a first training dataset 110, a first set of input color images 112, a second training dataset 114, an augmented set of color images 116, noisy images 118, new color images 122, a third training dataset 120, new color images 122, a neural network model124A for crop plant detection, a trained neural network model at a first stage 124B, and a trained neural network model at a second stage 124C. Furthermore, the camera apparatus 102 includes one or more processors 126.

In an exemplary implementation, the camera apparatus 102 may be mounted in a vehicle, such as a tractor or any other agricultural vehicle. The camera apparatus 102 is configured to capture an input color image for example, a color image that captures a portion (e.g., 1.75-2.25 meters or approximately 2 meters) of an agricultural field comprising soil and crop plants (e.g., cotton plant, chili plant, tomato plant, brinjal plant, castor plant, lettuce plant, potato plant, cabbage plant, cauliflower plant, and the like), hereinafter simply referred to as a crop image data) of an agricultural field. In an implementation, the camera apparatus 102 is configured to capture a wide field-of-view (FOV), for example, 1.75 to 2.25 meters of a physical agricultural field as compared to smaller FOV in conventional systems (typically less than 1.5 meters). In another implementation, a depth camera can be used to capture the input color images, especially in the case of lettuce thinning. Moreover, the FOV corresponds to approximately 2 meters of the agricultural field. In an implementation, the camera apparatus 102 may be oriented at a specific angle (e.g., 45 degrees or 60° degrees) in order to capture a few meters in a forward as well as in a downward direction, for example, up to 80-90 cm downwards or up to 1.7 to 2.25 meters ahead.

The training server 104 may be configured to store training datasets, such as the first training dataset 110, the second training dataset 114, and the third training dataset 120. Examples of implementation of the training server 104 may include, but are not limited to, an application server, a cloud server, a web server, or a combination thereof.

The computing device 108 is an electronic device that is capable of performing all the operations of the camera apparatus 102 except capturing the images. Examples of the computing device include but are not limited to a client device, a user computing device, or an embedded system.

The communication network 106 includes a medium (e.g., a communication channel) through which the training server 104, the camera apparatus 102, and the computing device 108 communicate with each other. Examples of the communication network 106 may include, but are not limited to, a cellular network (e.g., a 2G, a 3G, long-term evolution (LTE) 4G, a 5G, or 5G New Radio (NR) network, such as sub 6 GHZ, cmWave, or mmWave communication network), a wireless sensor network (WSN), a cloud network, a Local Area Network (LAN), a vehicle-to-network (V2N) network, a Metropolitan Area Network (MAN), and/or the Internet.

The one or more processors 126 may include suitable logic, circuitry, interfaces, and/or code that is configured to determine a plurality of crop image data variation classifications representative of real-world variations in the physical appearance of the crop plants as well as the surrounding area around the crop plant. Examples of the one or more processors 126 may include but are not limited to a system-on-module (SOM) processor, an integrated circuit, a co-processor, a microprocessor, a microcontroller, a complex instruction set computing (CISC) processor, an application-specific integrated circuit (ASIC) processor, a reduced instruction set (RISC) processor, a very long instruction word (VLIW) processor, a central processing unit (CPU), a state machine, a data processing unit, and other processors or circuits. Moreover, the one or more processors 126 may refer to one or more individual processors, processing devices, or a processing unit that is part of a machine. In an implementation, instead of the camera apparatus 102, the one or more processors 126 may be part of the training server 104 or the computing device 108.

In operation, the one or more processors 126 are configured to determine the plurality of crop image data variation classifications representative of real-world variations in the physical appearance of a crop plant as well as the surrounding area around the crop plant. The plurality of crop image data variation classification is utilized to accurately represent real-world variations in the physical appearance of the crop plant and the surrounding area in order to understand diverse aspects of crop plant images, such as the color of the crop plant, size of the crop plant, shape, and design of a leaf of the crop plant, its morphology, texture and the like. In an implementation, the one or more processors 126 are configured to determine the plurality of crop image data variation classifications representative of real-world variations in the physical appearance of a crop plant as well as the surrounding area around the crop plant based on pre-defined criteria automatically. In an implementation, the one or more processors 126 are configured to determine the plurality of crop image data variation classifications representative of real-world variations in the physical appearance of a crop plant as well as the surrounding area around the crop plant based on user inputs. Such determination of the plurality of crop image data variation is used to capture a comprehensive range of variations encountered in practical agricultural scenarios. In an implementation, the training server 104 is configured to store training datasets, such as the first training dataset 110, the second training dataset 114, and the third training dataset 120. In another implementation, the computing device 108 is configured to store training datasets, such as the first training dataset 110, the second training dataset 114, and the third training dataset 120. In yet implementation, the camera apparatus 102 is configured to store training datasets, such as the first training dataset 110, the second training dataset 114, and the third training dataset 120, such as in a memory of the camera apparatus 102.

In accordance with an embodiment, the plurality of crop image data variation classifications includes an age group variation of crop plants and a different time-of-day of capture of color images. In an implementation, the plurality of crop image data variation classification includes the age group variation of the crop plants. The crop plants at different growth stages may exhibit distinct visual characteristics, such as the height of the crop plants, the size of the crop plant, the color of the leaves of the crop plants, and the like. Moreover, the age group variation of the crop plants refers to the classification of the plurality of crop image data variation based on the age or growth stage of the crop plant, for example, 10 days old crop plant, 20 days old crop plant, 30 days old crop plant, young crop plant, mature crop plant, senescent crop plants, and the like. The classification of the crop image data variation based on the age group variation of crop plants is used for monitoring the different developmental stages of the crop plants, which can be further utilized to predict harvest times or identify potential issues at specific growth phases.

In another implementation, the plurality of crop image data variation classification includes the different time-of-day of capture of color images, such as 8:00 AM to 10:00 AM, 10:00 AM to 12:00 PM, 12:00 PM to 2:00 PM, 2:00 PM to 4:00 PM, 4:00 PM to 6:00 PM, 6:00 PM to 8:00 PM, and the like as the lighting conditions may vary throughout the day, impacting the appearance of the crop plants in the plurality of crop image data. For example, an image of the crop plant captured during the morning is brighter as compared to an image of the same crop plant captured during the evening due to which the identification of the crop plant by the one or more processors 126 may vary. Therefore, by considering the different time-of-day of the capture of color images, the one or more processors 126 are configured to accurately identify multiple changes in sunlight, shadows, and overall lighting conditions thereby, enhancing the accuracy of the camera apparatus 102 for detecting the crop plants irrespective of crop image data variations.

In accordance with an embodiment, the plurality of crop image data variation classifications further comprises a lighting environment variation comprising capturing color images of the plurality of different FOVs in a sunny lighting condition, in a cloudy weather, and in an artificial lighting condition. The sunny lighting condition, the cloudy weather, and the artificial lighting condition affect the plurality of crop image data, such as by casting shadows, influencing color tones, varying the intensity of the light, and the like. The lighting environment variation allows the plurality of crop image data variations to include images having different environmental scenarios with different lighting variations. As a result, the camera apparatus 102 is allowed to gain insights into how different lighting scenarios impact the visual data, contributing to a more comprehensive and accurate analysis of the plurality of crop plants.

In accordance with an embodiment, the plurality of crop image data variation classifications further comprises a weed density variation and a soil type variation. In an implementation, the weed density variation can be no weed density, low weed density, medium weed density, or high weed density. The weed density variation can impact the growth and health of crop plants due to which the physical appearance of the crop plants and the surrounding area may also vary. Therefore, by monitoring and understanding the weed density variation in the agricultural field, the camera apparatus 102 can execute multiple operations, such as spraying chemicals, controlling blades of the agricultural device (e.g., tractor) for uprooting the weeds, and the like for effective crop plant management. Furthermore, the soil type variation is used to detect variations in the soil types of the agricultural field, such as sandy, clay, silty, peaty, chalk, and loamy soil. The soil type variation has distinct visual characteristics, and by analyzing these soil type variations, the camera apparatus 102 is capable of detecting the crop plants and the surrounding areas of the crop plants more efficiently and accurately, such as by considering different factors, for example, color, texture, and the like. Additionally, by recognizing the soil type variations, the camera apparatus 102 is able to provide insights into soil health, fertility, and other factors that influence crop growth.

In accordance with an embodiment, the plurality of crop image data variation classifications further comprises a disease severity variation, a regional variation, a cropping seasons variation, and a crop type variation. The plurality of crop image data variation classifications can be used to detect and effectively manage the spread of diseases within the crop plants. In an implementation, the disease severity variation can be classified as low severity, medium severity, and high severity. Moreover, by recognizing the disease severity variations, the one or more processors 126 are configured to provide insights into the health status of the crop plants, facilitating timely intervention and disease control strategies. Similarly, the agricultural practices, climate, and soil conditions may vary from region to region, impacting the growth and health of the crop plant. Therefore, by understanding the regional variations, the one or more processors 126 are configured to provide region-specific insights, tailoring recommendations to the unique conditions of each area. Furthermore, the seasonal variations may also impact the growth of the crop plants, phenology, and potential challenges faced by the crop plants. Thus, it is required to train the neural network model to identify the cropping season variations. Different crops have unique visual characteristics, growth patterns, and susceptibility to diseases. Therefore, by classifying the crop plant image data based on the crop type variations, the one or more processors 126 are configured to identify and categorize the different crop types, such as Chili, Tomato, Brinjal, Castor, Lettuce, Potato, Cabbage, Cauliflower, and the like. Therefore, by considering the disease severity variation, the regional variation, the cropping seasons variation, and the crop type variation, the one or more processors 126 are configured to gain a detailed and nuanced understanding of the agricultural environment, providing more specific and targeted insights for effective crop management.

Furthermore, the one or more processors 126 are configured to select a first set of input color images 112 from a first training dataset 110 comprising a plurality of different field-of-views (FOVs) of one or more agricultural fields, based on the determined plurality of crop image data variation classifications. The first training dataset 110 refers to images of the plurality of different FOVs of the one or more agricultural fields, such as images comprising crop plants along with weeds, images of the agricultural field having uneven land, images having weeds only, and the like. Moreover, the selection of the first set of input color images 112 from the first training dataset 110 is performed based on the determined plurality of crop image data variation classifications, such as the disease severity variation, the regional variation, the cropping seasons variation, the crop type variation, the weed density variation the soil type variation, and the like. In an example, the first set of input color images 112 from the first training dataset 110 includes the age group variation of crop plants. In another example, the first set of input color images 112 from the first training dataset 110 includes the different time-of-day of capture of color images. Similarly, in yet another example, the first set of input color images 112 from the first training dataset 110 includes the lighting environment variation. In other words, the one or more processors 126 is configured to select the first set of input color images 112 from the first training dataset 110 in such a way that the selected first set of input color images 112 reflect diverse conditions and variations that are found in real-world agricultural fields. As a result, the selection of the first set of input color images 112 from the first training dataset 110 based on the determined plurality of crop image data variation classification enables the one or more processors 126 to handle multiple complexities and real-world environmental variations that are encountered while detecting the crop plants and the surrounding areas efficiently, accurately, and reliably.

In accordance with an embodiment, the one or more processors 126 are further configured to adjust a distribution of a number of input color images representative of each crop image data variation classification of the plurality of crop image data variation classifications for the selection of the first set of input color images 112 from the first training dataset 110. The distribution of the number of input color images involves manipulating the number of input color images associated with each crop image data variation classification in order to ensure a balanced and diverse set of images (i.e., the first set of input color images 112). As a result, by adjusting the distribution of the number of input color images, the one or more processors 126 are configured to learn from a balanced and diverse set of images for each crop image data variation that allows the camera apparatus 102 to adapt more diverse conditions present in real-world scenarios.

Furthermore, the one or more processors 126 are configured to execute a plurality of different image-level augmentation operations on the first set of input color images 112 to obtain an augmented set of color images 116. In other words, the execution of the plurality of different image level augmentation operations on the first set of input color images 112 includes different augmentation operations, such as mosaicking, masking partial plants, adjusting the hue, introducing shadows, flipping, rotating, and the like. The obtained augmented set of color images 116 comprises adjusted pixels representing the crop plants and unaltered pixels representing the crop plants and the surrounding region. Moreover, the obtained augmented set of color images 116 can be further utilized to provide a vast variety of images that can be further utilized to detect crop plants irrespective of crop image data variations accurately with reduced false positives and false negatives. Furthermore, the plurality of different image-level augmentation operations are designed to simulate different conditions and variations that the camera apparatus 102 may encounter in real-world scenarios. An example of the plurality of different image-level augmentation operations is further described in detail, for example, in FIG. 3A. Advantageously, the recall value and the accuracy of neural network model training, for crop detection are improved to more than 96% and 91% respectively.

In accordance with an embodiment, the one or more processors 126 are further configured to generate additional color images from one or more underrepresented crop image data variation classifications from amongst the plurality of crop image data variation classifications for a balanced representation of the plurality of crop image data variation classifications during the execution of the plurality of different image level augmentation operations. The generation of the additional color images from the one or more underrepresented crop image data variation classifications is used to ensure that the one or more processors 126 are exposed to a diverse and representative set of data focusing on the underrepresented variations. The underrepresented crop plant image data variation classification may include images that depict small plants, diseased, crop pant images having an intersection over union (IOU) less than a pre-defined threshold value (e.g., images having the IOU value less than 50%), image of the crop plant having confidence less than a predefined threshold value, weed occlusion, crop plant that is hard to identify, broad or narrow leaf, images having a plant that looks similar to the crop plant of interest, random objects near to the surrounding areas that make the identification difficult, and the like. Examples of the one or more underrepresented crop image data variation classifications (e.g., false positive classification, and the false negative classification) are further described in detail, for example, in FIG. 4A and FIG. 4B. As a result, the balanced representation of the plurality of crop image data variation classifications during the execution of the plurality of different image level augmentation operations is used to reduce false positives and false negatives that may occur due to the one or more underrepresented crop image data variations.

In accordance with an embodiment, the one or more processors 126 are further configured to execute a mosaicing operation on an input color image of the first set of input color images 112 to generate different combinations of spatial positions of the crop plant in a first plurality of output augmented images with new spatial arrangements of crop plants. Moreover, the mosaicing operation is one of the plurality of different image-level augmentation operations. In other words, the mosaicing operation includes stacking images horizontally as well as vertically and then cropping the stacked multiple images at different spatial locations in order to obtain the first plurality of output augmented images with new spatial arrangements of the crop plants. For example, by changing the position orientation, or scale of the input color image of the first set of input color images 112, the one or more processors 126 are configured to generate the first plurality of output augmented images. Moreover, the mosaicing operation creates multiple images of the input color image of the first set of input color images 112 by rearranging the spatial positions of the crop plants in order to obtain the first plurality of output augmented images. Beneficially, the first plurality of output augmented images can be further utilized to train a neural network model for detecting the crop plants with improved accuracy, efficiency, and reliability with reduced false positives and false negatives.

In accordance with an embodiment, the one or more processors 126 are further configured to execute a partial masking operation on one or more input color images of the first set of input color images 112 to generate a second plurality of output augmented images. Moreover, in the partials masking operation, a partially visible crop plant region in the one or more input color images is masked with black pixels and the partials masking operation is one of the plurality of different image-level augmentation operations. The partial masking operation is executed to mitigate potential confusion that might arise while detecting the crop plants and the surrounding areas due to the false detection from detected from the partially visible regions. For example, the partially visible region may represent certain plants, which may not be representative of the actual crop plant of interest. Therefore, the partially visible crop plant region in the one or more input color images is masked with black pixels to avoid such confusion and reduce false positives and false negatives. For example, if an input image shows a crop plant with only a portion of it visible due to occlusion or any other such factors, then, in that case, the partials masking operation creates a bounding box around the detected partially visible crop plant, and after that, mask the partially visible region with black pixels. Therefore, by masking the partially visible areas with black pixels, the camera apparatus 102 is configured to focus on more relevant and discernible features of the crops and detect the crop plant of interest accurately and efficiently thereby, reducing the likelihood of false positives.

In accordance with an embodiment, the one or more processors 126 are further configured to execute a no-feature crop plant masking operation on one or more input color images of the first set of input color images to generate a third plurality of output augmented images, and in the no-feature crop plant masking operation, a crop plant region in the one or more input color images is masked with black pixels when one or more criterions are met. Moreover, the no-feature crop plant masking operation is one of the plurality of different image-level augmentation operations.

In an implementation, the one or more criterions refer to certain criterions based on which the accurate detection of the crop plant is either not possible or the likelihood of getting false positives and false negatives is increased. For example, if the crop plant is too small (i.e., if the height of the crop plant is below a pre-defined threshold value, such as 10% of the image depicts the crop plant that cannot be detected), if the image is too blurred, or if the color cannot be displayed properly due to the reflection of the sunlight. In such a case, the corresponding parts of the image are masked with the black pixels. As a result, the camera apparatus 102 is configured to enhance the accuracy of the neural network model, which is trained for detecting the crop plants by preventing training of the neural network model based on the color image data that may cause confusion to the neural network model and may lead to an increased false positive and false negatives.

In accordance with an embodiment, the one or more criterions to mask the crop plant region in the one or more input color images with black pixels in the no-feature crop plant masking operation is one or more of: a size of the crop plant region is less than a defined threshold, the crop plant region is blurred, an absence of color information in the crop plant region due to light reflection, a presence of an object occluding the crop plant region in a range of 30-100 percent. In an implementation, the one or more criterions to mask the crop plant region in the one or more input color images with black pixels in the no-feature crop plant masking operation is that the size of the crop plant region is less than a defined threshold. In another implementation, the one or more criteria to mask the crop plant region in the one or more input color images with black pixels in the no-feature crop plant masking operation is that the crop plant region is blurred. In yet another implementation, the one or more criterions to mask the crop plant region in the one or more input color images with black pixels in the no-feature crop plant masking operation is the absence of color information in the crop plant region due to light reflection. In another implementation, the one or more criterions to mask the crop plant region in the one or more input color images with black pixels in the no-feature crop plant masking operation is the presence of an object occluding the crop plant region in a range of 30-100 percent. As a result, the no-feature crop plant masking operation is executed to improve the quality of the first training dataset 110 for the neural network model by excluding the regions of the images that might contribute to confusion or inaccuracies in the detection of the crop plants and the surrounding areas.

In accordance with an embodiment, the one or more processors 126 are further configured to execute a selective soil augmentation operation on one or more input color images of the first set of input color images to generate a fourth plurality of output augmented images. Moreover, in the selective soil augmentation operation, a Hue, Saturation, and Value (HSV) augmentation is exclusively applied to pixels corresponding to a soil region without affecting pixels of a crop plant region in each of the one or more input color images and the selective soil augmentation operation is one of the plurality of different image level augmentation operations. The HSV augmentation corresponds to an image level augmentation operation that includes modification of the different parameters of the first set of input color images, such as modifying brightness, color intensity, and the like without affecting the pixels of the crop plant region. In an implementation, the value of H is different for different colors, for example, for green color, H will have a certain value, for red color, H will have another value, and the like.

S (saturation) represents the number of colors present in the input color image and V (value) is for brightness. Moreover, the crop plant region corresponds to a region that shows the crop plants captured in the first set of the input color images. The generated fourth plurality of output augmented images include images that represent a variation in the soil type without altering the pixels of the crop plant region, which can be further utilized to train the neural network model for the identification of the different types of soil accurately and reliably with reduced false positives and false negatives. As a result, the HSV augmentation is used to simulate and consider different types of color (e.g., different variations of green color to detect the crop plants) that may occur in real-world scenarios.

In accordance with an embodiment, the one or more processors 126 are further configured to execute a shadow augmentation operation on the one or more input color images of the first set of input color images to generate a fifth plurality of output augmented images, and in the shadow augmentation operation, one or more shadows are randomly applied at different portions in the one or more input color images. Moreover, the shadow augmentation operation is one of the plurality of different image-level augmentation operations. Due to the absence of hoods (i.e., the devices that are used to prevent unwanted light from entering the camera lens) that are used to block external light and shadows from the surrounding objects, the one or more input color images may include uneven lighting, sharp edges, and corners. Therefore, the shadow augmentation operation is used to address the presence of shadows caused by various objects (e.g., boom, spraying nozzle, and the like) and sudden changes in illumination that create contrasting regions in the corresponding image. Such image-level augmentation operation introduces shadows randomly across different areas of the image to mitigate the impact of sharp edges and corners thereby ensuring robust training by simulating diverse lighting conditions and reducing sensitivity to specific image characteristics.

In accordance with an embodiment, the one or more processors 126 are further configured to execute a dataset-level augmentation by adding in the first set of input color images, one or more secondary crop plant images as negative examples in addition to a primary crop plant that is to be detected. Unlike image-level augmentations that are applied to individual images, dataset-level augmentation includes the addition of different variations (e.g., color images with false positives and false negatives) to the complete set or collection of images used for training. Moreover, the dataset level augmentation is applied to further diversify the training dataset. It involves introducing broader variations or transformations across the complete collection of images, contributing to a more comprehensive and adaptable training set. Therefore, the combination of the plurality of image-level augmentation operation and the dataset-level augmentation enhances the overall accuracy of the neural network model in detecting the crop plants.

Furthermore, the one or more processors 126 are configured to identify and filter the noisy images 118 from a second training dataset 114 comprising the first set of input color images 112 and the augmented set of color images 116 based on a predefined set of image parameters. The identification and filtration of noisy images are carried out based on a predefined set of image parameters. Moreover, the predefined set of image parameters may include, but are not limited to a blurred image, an image that may include plants that are not clearly visible, too small plants (i.e., the plants having a height less than the threshold value), an image representing weed or any random object occluding the plant, and the like without affecting the scope of the present disclosure. Firstly, the one or more processors 126 are configured to identify the images (i.e., the noisy images 118) from the second training dataset 114 based on the predefined set of image parameters. Thereafter, the one or more processors 126 are configured to filter the identified images (i.e., the noisy images 118). The noisy images 118 may include certain unwanted elements or artifacts that can adversely impact the training of the neural network model, which is used by the camera apparatus 102 to accurately detect the crop plants and the surrounding areas. Advantageously, by executing the masking operations (e.g., the partial masking operation and the no-feature crop plant masking operation) and by removing the noisy images 118, the recall value and the accuracy of model training, for crop detection are improved to more than 98% and 94% respectively, generally found be in range of 94-99.999 percent, thereby manifesting enhanced error handling, i.e., almost negligible number to no errors (i.e., no false positives or false negatives).

Furthermore, the one or more processors 126 are configured to train the neural network model in a first stage 124B on a third training dataset 120 comprising noise-filtered images 128 from the second training dataset 114. In an implementation, the neural network model 124A and the trained neural network model may be stored in the training server 104. In another implementation, the neural network model 124A and the trained neural network model may be stored in the computing device 108. In yet another implementation, the neural network model 124A and the trained neural network model may be stored in the camera apparatus 102. The training of the neural network model in the first stage 124B caused the neural network model to learn different types of crop plants and the surrounding area and a range of color variations of the different types of crop plants along with the different types of variations, such as the age of the crop plant, diseases, and the like. The neural network model is trained to discern and identify different types of crop plants present in agricultural fields, such as by recognizing a diverse spectrum of variations (e.g., color of leaves, size of crop plant, age of the crop plant, time of capturing, soil type, and the like) within the agricultural field. Moreover, the inclusion of the noise-filtered images 128, such as by filtering out the noisy images 118 simulates the real-world variations that are further used to improve the robustness and accuracy of the neural network model in identifying different types of crop plants during subsequent real-time applications. With more accurate crop detection, camera-driven agricultural machines manifest improved precision spraying of chemicals, like plant nutrients, weedicides, herbicides, insecticides, etc., resulting in improved crop management, potentially leading to improved yields. Accurate crop detection leads to more efficient use of resources like water, fertilizers, and pesticides, as the precise location and health of the crops are known. In an implementation, the method can be easily integrated into existing precision agriculture technologies, such as automated tractors, for real-time crop monitoring and management.

Furthermore, the one or more processors 126 are configured to re-determine new crop image data variation classifications and re-select new color images representative of the new crop image data variation classifications. The re-determination and re-selection of the new color images 122 are performed to update the training dataset (i.e., the first training dataset 110, the second training dataset 114, and the third training dataset 120). Such update allows the neural network model to detect the crop plants and the surrounding areas accurately based on the evolving agricultural scenarios, such as changes in the physical appearance of the crop plant due to the change in the climatic conditions, cracks in the soil, changes due to the addition of the manure or pesticide, new diseases, and the like. As a result, the utilization of the dataset, which is consistently refreshed with the latest understanding of the crop variations enhances the overall performance of camera apparatus 102, leading to more accurate and insightful outcomes in order to provide effective crop management.

The one or more processors 126 are configured to further train the neural network model in a second stage 124C from the new color images 122 representative of the new crop image data variation classifications to detect one or more crop plants. The further training of the neural network model in the second stage 124C is implemented to refine and enhance the accuracy of the neural network model based on the new color images 122 representing the updated classifications of crop image data variations. An example of an increase in the accuracy level of the neural network model as compared to the conventional models that are used for the crop plant detection is given in Table 1 provided below.

TABLE 1

| Model Family | Model | Precision | Recall |
| --- | --- | --- | --- |
| R-CNN | Conventional R-CNN based model | 83.89% | 88.56% |
| Single shot detector (SSD) | Conventional SSD based model (e.g., mobileNet-V1) | 88.48% | 85.65% |
|  | Conventional RetinaNet | 81.93% | 96.52% |
| Neural network model 124A | Neural network model 124A | >96.6% | >97.1% |

In the Table 1, the faster R-CNN is known in art, and is a two-stage model divided into: a. Region Proposal Network (RPN), which uses a separate network to propose regions of interest (ROIs) where objects might be present; and b) Fast R-CNN detector, which classifies each ROI and refines its bounding box using convolutional layers and fully connected layers. The R-CNN is also a two-stage model: a) External region proposal, which uses external algorithms like Selective Search to generate ROIs; and b) a Detector, which is similar to Faster R-CNN's detector, classifying and refining each ROI. The conventional models' accuracy was low as compared to the neural network model 124A when trained using an innovative training method and operations (e.g., FIGS. 3A to 3D, 4A, 4B, 5, 6, and 7A and 7B). The neural network model 124A may be a single-stage model, which may predict bounding boxes and class probabilities directly from the image in one go, using convolutional layers and anchor boxes. The neural network model 124A may be re-configured with hyperparameters, for example, scale parameter may be set to 0.5. This scales input images down to 50% of their original size, potentially balancing accuracy, and computational cost for crop detection. "Shear" parameter may be 0.0—No random shearing augmentation is used, but it could enhance robustness to variations in crop shapes. "Translate" parameter may be 0.1—Minor horizontal translation augmentation is applied, potentially improving generalization to diverse crop positions. Further, "task" parameter may be set to "segment"—The neural network model 124A is configured for segmentation, which might be useful for pixel-level crop identification or specific tasks beyond bounding box detection. Further, "vid_stride" parameter may be set to 1, meaning every frame is used. Additionally, the mean average precision of the neural network model 124A is greater than 99.36% as compared to the conventional models that are used for the crop plant detection. As a result, by training the neural network model 124A, the camera apparatus 102 is able to handle diverse crop variations and achieve higher precision and sensitivity in detecting crop plants.

In accordance with an embodiment, the one or more processors 126 are further configured to identify a plurality of error types in a plurality of images in which one or more crop plants are not detected during the evaluation of the trained neural network model in the first stage124B. Furthermore, the one or more processors 126 are configured to classify the identified plurality of error types into a false negative class and a false positive class and rank each error type of the identified plurality of error types in terms of a severity parameter and a number of errors to prioritize the re-determination of the new crop image data variation classifications. By classifying the error types into the false negative class and the false positive class and assigning the severity levels based on the impact of each error type, the one or more processors 126 are configured to prioritize and address the most critical and frequently occurring errors. Firstly, the one or more processors 126 are configured to analyze the plurality of images and identify instances where crop plants were not detected. Thereafter, the identified instances are classified based on the plurality of error types, such as the false negative class and the false positive class. In an implementation, the false negative class refers to a class of error type that includes missed detections. In another implementation, the false positive classes refer to a class of error type that includes an incorrect identification of the crop plants and the surrounding areas. After the classification of the plurality of error types, the one or more processors 126 are configured to assess the severity of each of the types of the error and thereafter rank each of the error types based on the severity parameter. For example, the error types that are more severe are ranked first and given more priority as compared to the error types having less severity. Advantageously, by ranking each error type in terms of the severity parameter the recall value and the accuracy of neural network model training, for crop detection are improved to more than 99% and 96% respectively, generally found to be in the range of 94-99.999 percent, thereby manifesting enhanced error handling, i.e., almost negligible number to no errors (i.e., no false positives or false negatives).

Advantageously, the camera apparatus 102 is configured to provide the accurate and the reliable training of the neural network models, when the neural network model is trained by the diverse set of augmented color images, including the generated augmented set of color images 116. The plurality of crop image data variation classifications is used to generate the balanced training dataset that includes different real-world scenarios, enhancing the robustness, effectiveness, and the accuracy of the neural network model, while maintaining the accuracy of crop detection, thereby contributing to improved crop monitoring and management.

Figure 2A:
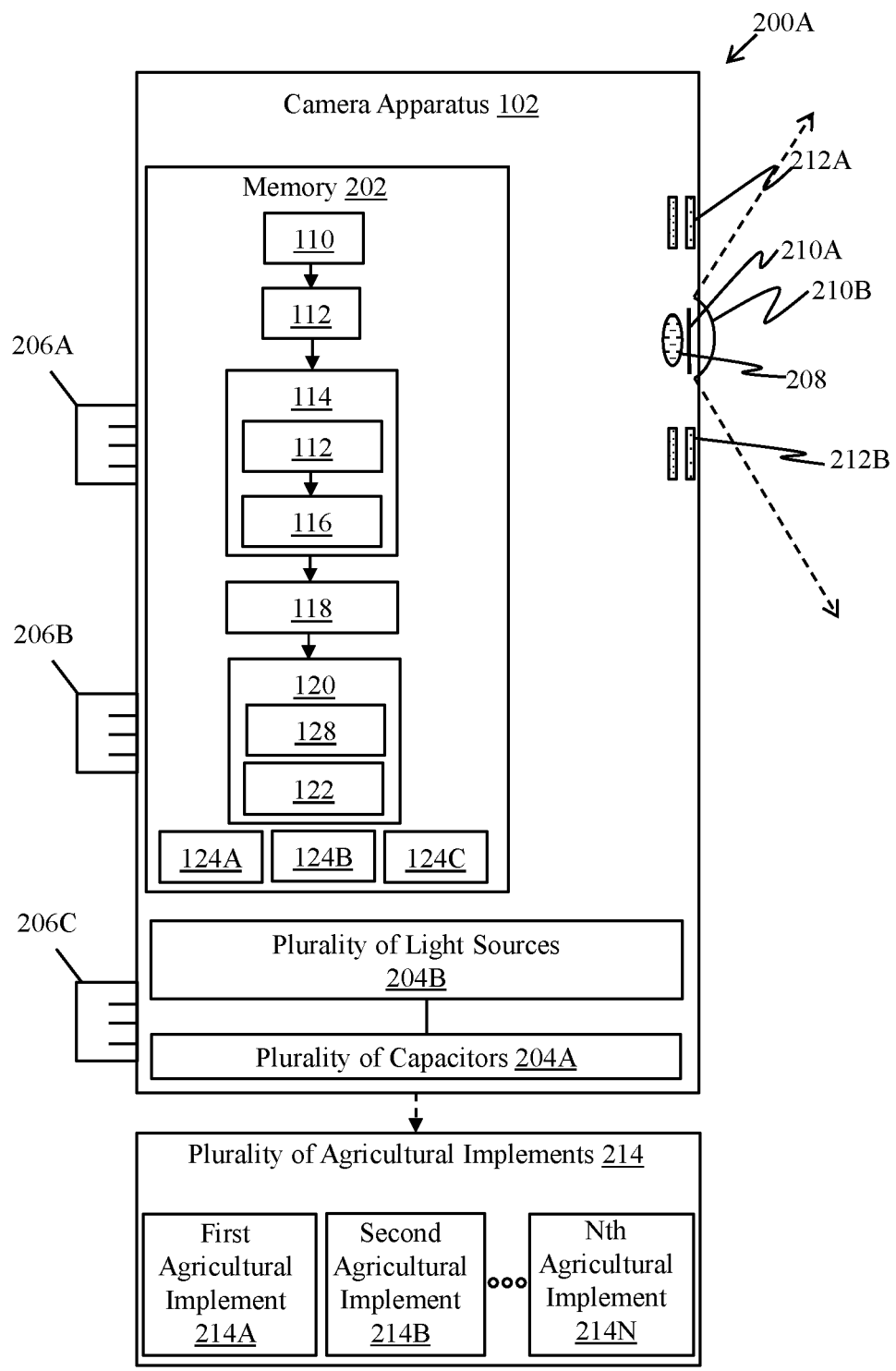
FIG. 2A is a block diagram illustrating various exemplary components of a camera apparatus, in accordance with another embodiment of the present disclosure.

FIG. 2A is a block diagram illustrating various exemplary components of a camera apparatus, in accordance with another embodiment of the present disclosure. FIG. 2A is described in conjunction with elements from FIG. 1. With reference to FIG. 2A, there is shown a block diagram 200A of the camera apparatus 102 (of FIG. 1). The camera apparatus 102 may further include a memory 202, a plurality of capacitors 204A, a plurality of light sources 204B, and a plurality of connectors, such as a first connector 206A, a second connector 206B, a third connector 206C, an image sensor 208, a lens 210A, a lens protector 210B, a first light diffuser 212A, and a second light diffuser 212B in addition to the components shown and described, for example, in the FIG. 1. Furthermore, the one or more processors 126 may be configured to operate at least one of a plurality of agricultural implements 214, such as a first agricultural implement 214A. The plurality of agricultural implements 214 may include N agricultural implements, such as the first agricultural implement 214A, a second agricultural implement 214B, and up to a Nth agricultural implement 214N.

The memory 202 may include suitable logic, circuitry, interfaces, and/or code that is configured to store machine code and/or instructions executable by the one or more processors 126. Examples of implementation of the memory 202 may include, but are not limited to, a Solid-State Drive (SSD), an Electrically Erasable Programmable Read-Only Memory (EEPROM), Random Access Memory (RAM), Read Only Memory (ROM), Hard Disk Drive (HDD), Flash memory, a Secure Digital (SD) card, a computer-readable storage medium, and/or CPU cache memory. The memory 202 is configured to store the first training dataset 110, the first set of input color images 112, the second training dataset 114, the augmented set of color images 116, the noisy images 118, the third training dataset 120, the noise-filtered images 128, the new color images 122, and the neural network model 124A at different stages (e.g., the first stage 124B, and the second stage 124C). The memory 202 may store an operating system and/or a computer program product to operate the camera apparatus 102. A computer-readable storage medium for providing a non-transient memory may include, but is not limited to, an electronic storage device, a magnetic storage device, an optical storage device, an electromagnetic storage device, a semiconductor storage device, or any suitable combination of the foregoing. In FIG. 2A, both the neural network model 124A and the trained neural network model are stored in the memory 202. In another implementation, the neural network model 124A and the trained neural network model may not be stored in the memory 202.

In an implementation, each of the plurality of capacitors 204A may be used to supply consistent power to the plurality of light sources 204B (such as LED or strobe lights) to generate high-intensity light flashes for a very short duration in sync with the operation of the image sensor 208 of the camera apparatus 102 to capture a first set of input color images of the agricultural field. Furthermore, the first connector 206A may be used as a power supply port to power the camera apparatus 102. The second connector 206B is configured to connect to one or more agricultural implements, such as a chemical sprayer or a mechanical implement to actuate cutting blades, to actuate the one or more agricultural implements, devices, or tools. In an implementation, the second connector 206B may include multiple pins that can handle multiple actuation units, concurrently. For example, the camera apparatus 102 may include an integrated PCB that includes a plurality of actuators (e.g., 6-20 actuator chips) that may handle a plurality of electronically controllable spray valves in a sprayer. The third connector 206C is configured to establish a network with other camera apparatuses or other devices (e.g., a display apparatus) mounted in an agricultural vehicle or machine. In an example, the network may be a local area network (LAN) connection.

The image sensor 208 is configured to capture an input color image of a field-of-view (FOV) of an agricultural field. The FOV of the input color image may range from 1.75 to 2.25 meters of the agricultural field. For example, 2 meters of agricultural fields that may include a substrate (such as soil) and crop plants growing on the substrate, may be captured in the FOV.

Examples of implementation of the first agricultural implement 214A may include, but are not limited to, a sprayer comprising a plurality of electronically controllable spray nozzles and a cutter comprising a plurality of electronically controllable cutting blades (e.g., for lettuce thinning). Examples of implementation of the second agricultural implement 214B may include, but are not limited to, a precision spot sprayer comprising a plurality of electronically controllable spray nozzles for spraying weedicide on the one or more weed regions in the agricultural field and a cutter comprising a plurality of electronically controllable cutting blades (e.g., for uprooting weeds), a laser-based device to emit laser beams on the one or more weed regions, or other means of killing, uprooting pruning, or dislocating weeds.

In accordance with an embodiment, the camera apparatus 102 may further comprise the lens 210A and the lens protector 210B that covers the lens 210A and the image sensor 208 of the camera apparatus 102. Alternatively stated, the lens 210A is positioned between the image sensor 208 and the lens protector 210B. The lens protector 210B may be configured as a filter screen to prevent dust particles and ultra-violet (UV) light from entering the image sensor 208 of the camera apparatus 102. The lens protector 210B may also be referred to as a lens protection filter that further protects from fogging. In an implementation, the lens protector 210B may be an anti-fogging glass that also protects the lens 210A and the image sensor 208 from dust, spray mist, and UV light.

In accordance with an embodiment, each of the first light diffuser 212A and the second light diffuser 212B may be configured to diffuse light emitted from a plurality of light sources, when the camera apparatus 102 is in operation to capture the input color image. The plurality of light sources may include, but is not limited to, light emitting devices (LED), strobe-lights integrated into a light control printed circuit board (PCB). The light control PCB further comprises capacitors to power the LED or strobe lights (not shown for brevity). In an implementation, the camera apparatus 102 may comprise a passive heat sink (not shown) to dissipate heat generated by the one or more processors 126 (e.g., the SOM processor) of the camera apparatus 102.

Figure 2B:
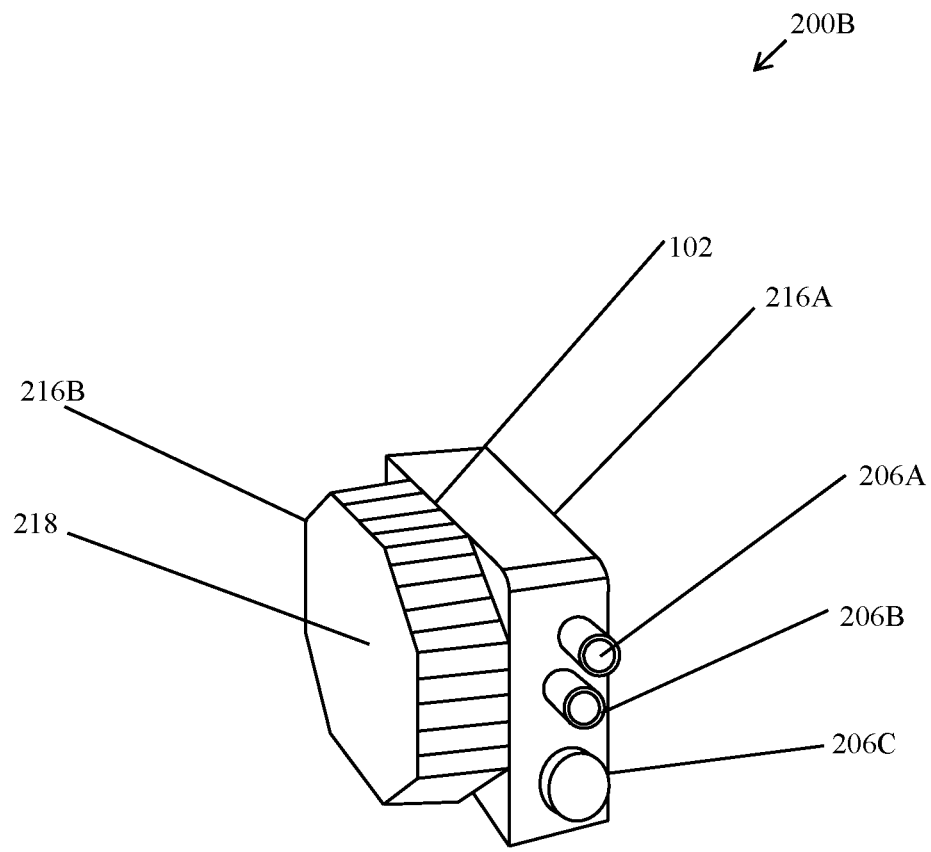
FIG. 2B is a diagram illustrating a perspective rear view of a camera apparatus, in accordance with an embodiment of the present disclosure.

FIG. 2B is a diagram illustrating a perspective rear view of a camera apparatus, in accordance with an embodiment of the present disclosure. FIG. 2B is described in conjunction with elements from FIGS. 1 and 2A. With reference to FIG. 2B, there is shown a perspective rear view 200B of the camera apparatus 102.

The perspective rear view 200B of the camera apparatus 102 shows a rear side 216B of the camera apparatus 102, and each of the plurality of connectors, such as the first connector 206A, the second connector 206B, and the third connector 206C. The plurality of connectors may be provided at the lateral side of the camera apparatus 102. The rear side 216B of the camera apparatus 102 comprises a passive heat sink 218. The passive heat sink 218 is used to dissipate the heat generated by one or more processors, such as the one or more processors 126 of the camera apparatus 102.

Figure 2C:
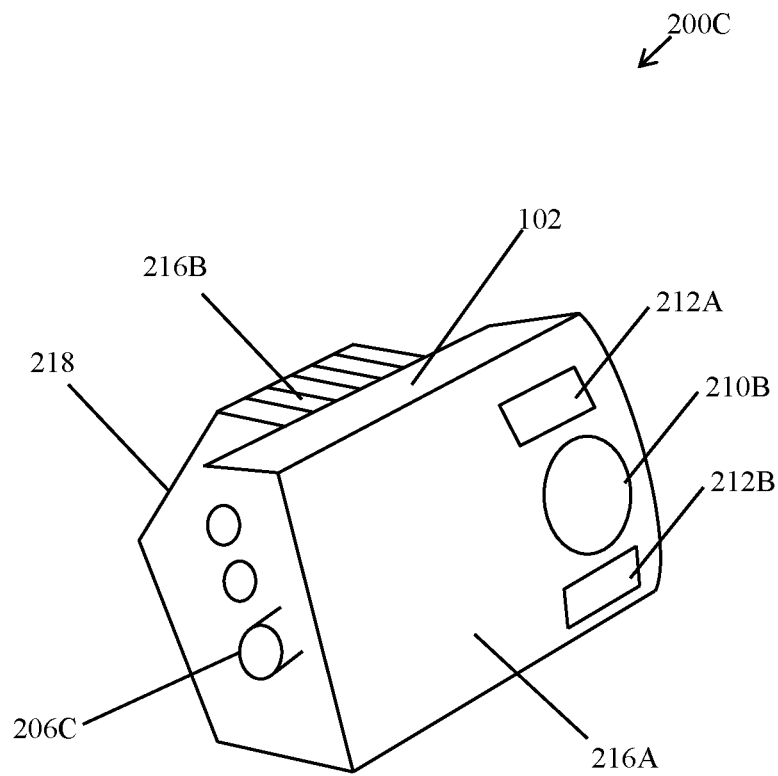
FIG. 2C is a diagram illustrating a perspective front view of a camera apparatus, in accordance with an embodiment of the present disclosure.

FIG. 2C is a diagram illustrating a perspective front view of a camera apparatus, in accordance with an embodiment of the present disclosure. FIG. 2C is described in conjunction with elements from FIGS. 1, 2A, and 2B. With reference to FIG. 2C, there is shown a perspective front view 200C of the camera apparatus 102.

The perspective front view 200C of the camera apparatus 102 shows a front side 216A of the camera apparatus 102. The front side 216A of the camera apparatus 102 comprises the image sensor 208, the lens protector 210B, and the plurality of light diffusers, such as the first light diffuser 212A and the second light diffuser 212B. A plurality of light sources (not shown) is disposed around the image sensor 208 at two or more concentrated regions behind the first light diffuser 212A and the second light diffuser 212B.

Figure 2D:
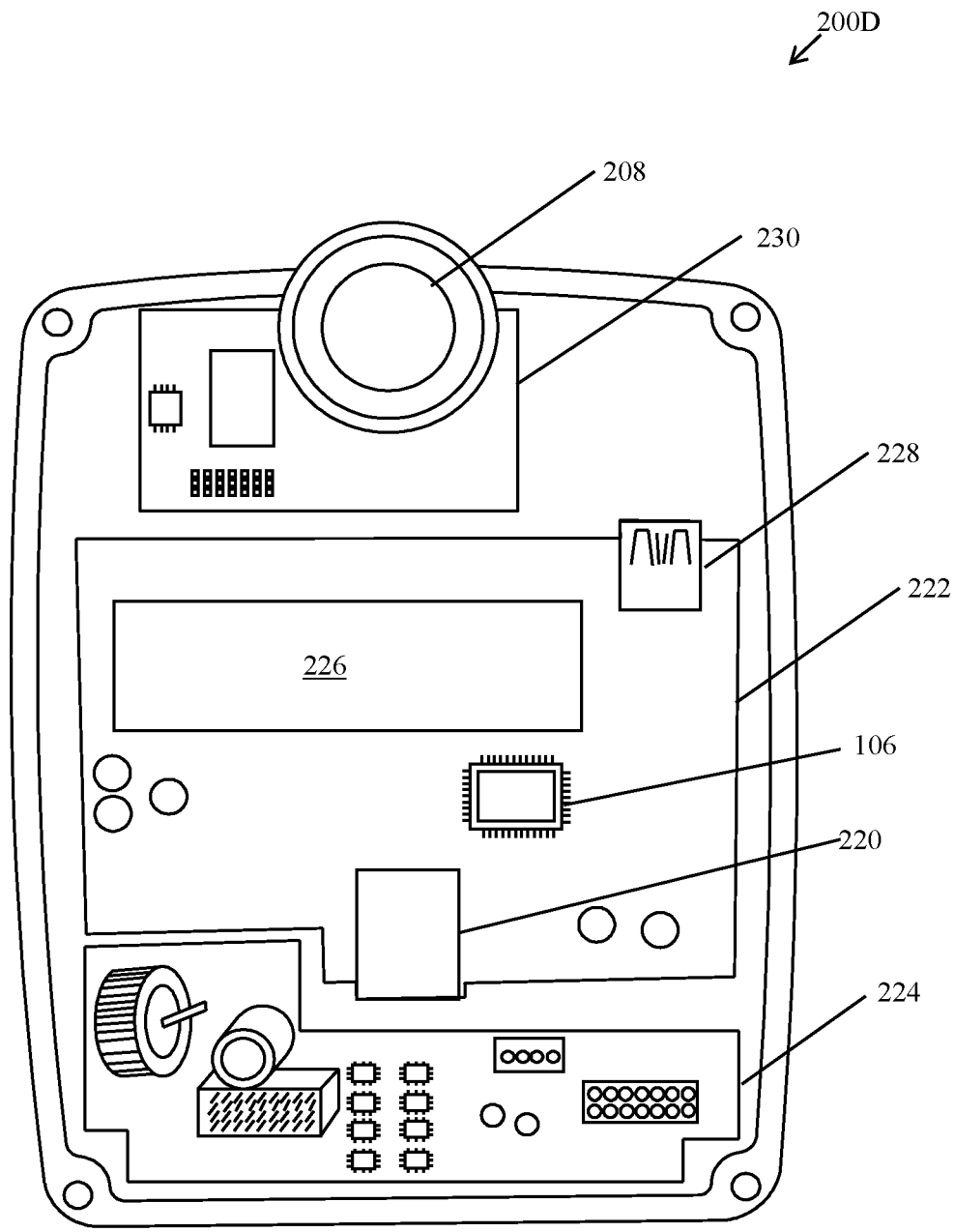
FIG. 2D is a diagram illustrating an arrangement of a custom-built printed circuit boards and internal components of a camera apparatus, in accordance with an embodiment of the present disclosure.

FIG. 2D is a diagram illustrating various internal components of a camera apparatus, in accordance with an embodiment of the present disclosure. FIG. 2D is described in conjunction with elements from FIGS. 1, 2A, 2B, and 2C. With reference to FIG. 2D, there are shown a first printed circuit board (PCB) 220, a second PCB 222, and a third PCB 224. The first PCB 220 is configured as an image sensing and light control board, the second PCB 222 is configured as a custom-designed motherboard and the third PCB 224 is configured as a power supply board. The first PCB 220 comprises the image sensor 208. The plurality of light sources 204B (not shown here) may be strobe LED PCBs (e.g., different PCBs) arranged on different regions (e.g., either side) of the first PCB 220 serving as strobe light with LED and capacitors, such as the plurality of capacitors 204A. In an example, the plurality of light sources 204B may be disposed around the image sensor 208 at two or more concentrated regions and powered by the plurality of capacitors 204A. The second PCB 222 comprises a storage device 226 (e.g., a solid-state drive (SSD), a universal serial bus (USB) port 228, and an ethernet module 230. The one or more processors 126 are integrated into the second PCB 222. The third PCB 224 is configured to power the components of the first PCB 220 and the second PCB 222. The third PCB 224 comprises a number of actuators (e.g., actuator chips) and DC-to-DC converters.

Figure 3A:
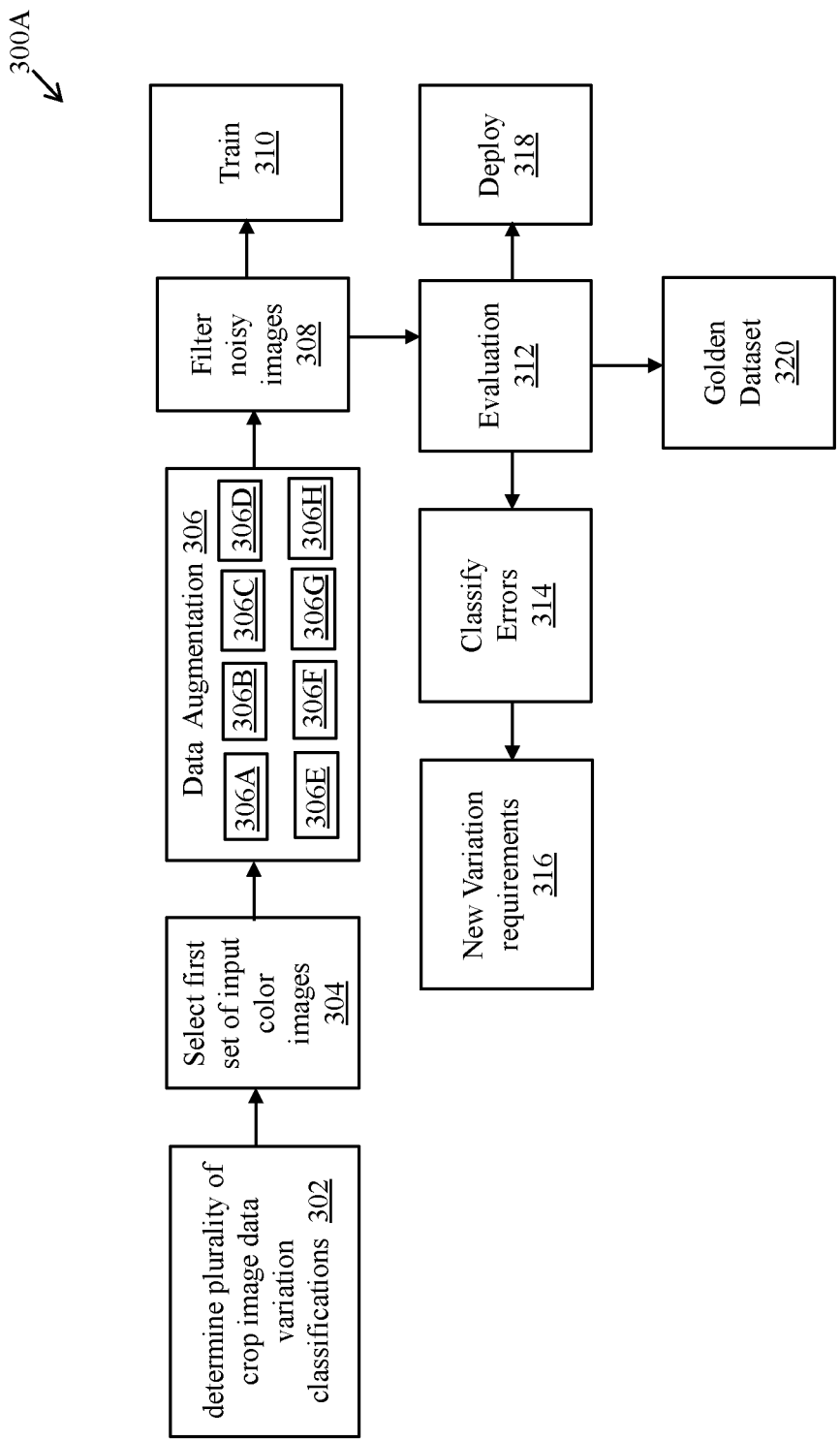
FIG. 3A is a diagram illustrating a training phase of a neural network model for crop plants detection, in accordance with an embodiment of the present disclosure.

FIG. 3A is a diagram illustrating a training phase of a neural network model for crop detection, in accordance with an embodiment of the present disclosure. FIG. 3A is described in conjunction with elements from FIGS. 1, and 2A-2D. With reference to FIG. 3A, there is shown a training phase 300A of the neural network model 124A. The training phase of the neural network model 124A includes operations 302 to 320.

At operation 302, the one or more processors 126 are configured to determine the plurality of crop image data variation classifications representative of real-world variations in the physical appearance of a crop plant as well as the surrounding area around the crop plant. In an implementation, the plurality of crop image data variation classifications in the collected data may include but are not limited to an age group (e.g., 10 days, 20 days, 30 days, and the like) of the crop plant, time of capture (e.g., 8 AM to 10 AM, 10 AM to 12 PM, 12 PM to 2 PM, 2 PM to 4 PM, 4 PM to 6 PM, 6 PM to 8 PM, and the like), lighting (e.g., bright light during sunny day, dull light during cloudy, artificial light (during night time), and the like), weed density (e.g., no weed, low weed, medium weed, and high weed), soil conditions (e.g., wet soil, dry soil, cracked soil, and the like), disease severity (e.g., highly affected crop plant, medium affected and low or not affected crop plants). In addition, the plurality of crop image data variation classifications in the collected data may also include region (e.g., dry region, wet region, and the like), season (e.g., rainy season, rabi season, kharif season, and the like), and the type of crop plant (e.g., Cotton, Chili, Tomato, Brinjal, Castor, Lettuce, Potato, Cabbage, Cauliflower, and the like).

At operation 304, the one or more processors 126 are configured to select the first set of input color images 112 from the first training dataset 110 comprising the plurality of different field-of-views (FOVs) of one or more agricultural fields, based on the determined plurality of crop image data variation classifications. For example, one million color images may be captured initially by the image sensor 208 (of the camera apparatus 102). In another implementation, more than one million color images can be captured by the image sensor 208 of the camera apparatus 102. The camera apparatus 102 may be configured to capture the first set of input color images of one or more agricultural fields. For example, agricultural fields of crop plants like chili, brinjal, lettuce, potato, tomato, cabbage, cauliflower, carrot, radish, cotton, and the like may be captured. Such agricultural fields may also include different varieties of weeds along with crop plants. In the training phase, thousands of different images (e.g., images of cotton plants or other crop plants) may be captured in different locations, different positions (e.g., towards the sun), at different times of day (e.g., early morning, evening, or night), and at different growth stages (e.g., two-day cotton plant, three-day cotton plant), or different health state may be used. Various soil types like brown soil, greenish soil, black soil, and cracks on soil, i.e., different texture and color of soil may be included in the first training dataset. A FOV of approximately 2 meters may be used to capture the first set of input color images of one or more agricultural fields.

At operation 306, the one or more processors 126 are configured to execute the plurality of different image level augmentation operations on the first set of input color images 112 to obtain the augmented set of color images 116, such as mosaicking image level augmentation operation 306A, masking partials image level augmentation operation 306B, scaling image level augmentation operation 306C, the HSV image level augmentation operation 306D, rotation image level augmentation operation 308E, shadow image level augmentation operation 306F, translation image level augmentation operation 306G, and a flipping image level augmentation operation 306H. In addition, the dataset-level augmentation in addition to the plurality of different image-level augmentation operations are also applied to the acquired color input images. The one or more processors 126 are configured to incorporate the dataset-level augmentation. The combination of the plurality of image-level augmentation operation and the dataset-level augmentation enhances the overall accuracy of the neural network model 124A for detecting the crop plants.

At operation 308, the one or more processors 126 are configured to identify and filter the noisy images 118 from the second training dataset 114 comprising the first set of input color images 112 and the augmented set of color images 116 based on a predefined set of image parameters.

At operation 310, the one or more processors 126 are configured to utilize the generated augmented color image in the training of the neural network model 124A for crop detection, such as training of the neural network model at first stage 124B and the training of the neural network model at the second stage 124C.

At operation 312, the neural network model 124A is evaluated, such as by comparing the trained neural network model with a golden dataset (i.e., at operation 320). Moreover, the golden dataset refers to a dataset that includes a set of color images with variations and is considered as a reference for the evaluation of the accuracy level of the neural network model 124A.

At operation 318, the neural network model (i.e., the neural network model trained at the second stage 124C) is deployed to the camera apparatus 102 in order to allow the camera apparatus 102 to detect the plurality of different types of crop plants and the surrounding areas. In an implementation, if the accuracy of the neural network model is beyond a certain threshold, then in that case, the neural network model is deployed. Alternatively, if the accuracy of the neural network model is less than the threshold, then in that case, the neural network model is not deployed.

At operation 314, the one or more processors 126 are configured to perform error classification. Moreover, the error classification corresponds to a classification of errors in different classes based on the number and severity of the errors (i.e., false negative and false positive). In an implementation, the number of errors can be further ranked and prioritized accordingly in order to fix the corresponding errors that lead to an enhancement of the accuracy of the neural network model. In other words, the images that include the plants or the soil regions that are not detected are collected. After that, the collected images are categorized into different classes of errors, such as a false negative class and a false positive class. In an implementation, the false negative class includes the images that show, small plants that cannot be identified, diseased plants, images having less confidence level than a pre-defined threshold value, having insertion over union (IOU) less than a threshold (e.g., 50%), images with weed occlusion, images in which the plants or soil regions are hard to identify, and the like. In another implementation, the false positive class includes images that show a broad leaf that cannot be identified as a crop or a weed, a plant that looks similar to the plant of interest, a diseased plant, random objects, partial representation of the crop plant, image with narrow leaf and is hard to identify, and the like. Moreover, the classification of the errors can be performed manually, such as by a user, or through semi-automated methods or techniques.

After the classification of the errors, the one or more processors 126 are configured to identify the new variation requirements, such as at operation 316. Moreover, such identification of the new variation requirements is further utilized by the one or more processors 126 to train the neural network model 124A. Therefore, the camera apparatus 102 is configured to allow the neural network model 124A to learn the plurality of different types of crop plants effectively and accurately. In addition, the evaluation of the neural network model, performing error classification, and the identification of the new variation requirements ensures a continuous improvement and adaptation to real-world scenarios thereby, enhancing the accuracy of the crop plant detection in the agricultural field.

Figure 3B:
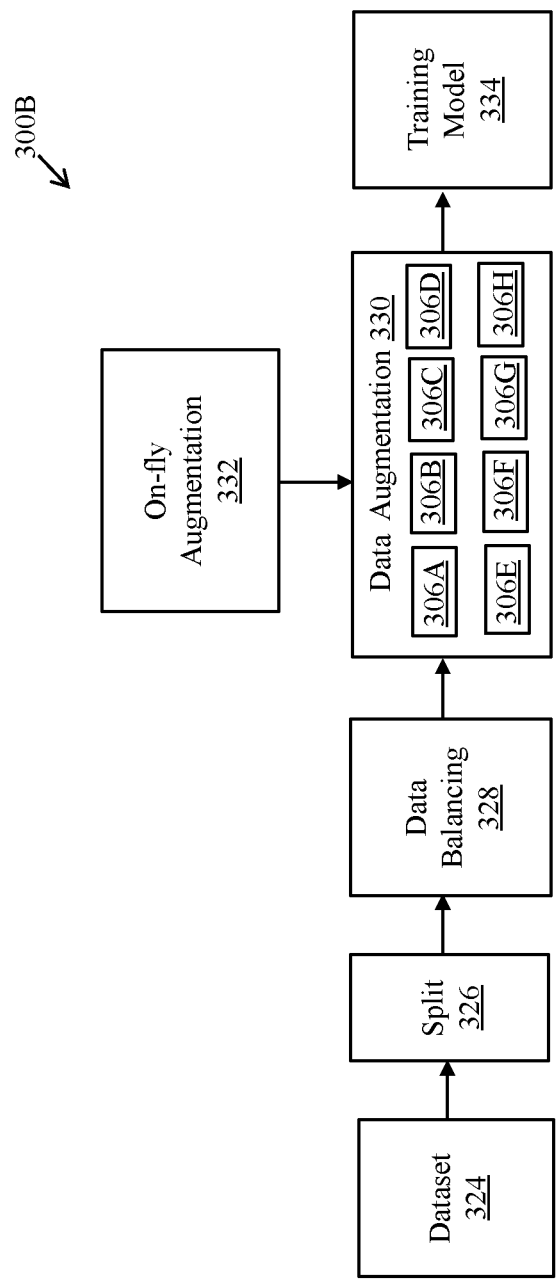
FIG. 3B is a diagram that depicts a flowchart for handling data variations with data augmentation for training of a neural network model for crop plants detection, in accordance with an embodiment of the present disclosure.

FIG. 3B is a diagram that depicts a flowchart for handling data variations with data augmentation, in accordance with an embodiment of the present disclosure. FIG. 3B is described in conjunction with elements from FIGS. 1, 2A-2D, and 3A. With reference to FIG. 3B, there is shown a flow chart 300B for handling data variations with data augmentation. As shown in FIG. 3B, the flow chart 300B includes a series of operations 324 to 334.

At operation 324, the one or more processors 126 are configured to receive an image dataset after the annotation of the color input image data, which is captured by the image sensor 208. Furthermore, at operation 326, the received data set gets split into three different classes, such as a training dataset, a validation dataset, and a testing dataset. After that, at operation 328, the data is balanced according to the different variations, such as the age group (e.g., 10 days, 20 days, 30 days, and the like) of the crop plant, the time of capture (e.g., 8 AM to 10 AM, 10 AM to 12 PM, 12 PM to 2 PM, 2 PM to 4 PM, 4 PM to 6 PM, 6 PM to 8 PM, and the like), the lighting (e.g., bright light during sunny day, dull light during cloudy, the artificial light (during night time), and the like), the weed density (e.g., no weed, low weed, medium weed, and high weed), the soil conditions (e.g., wet soil, dry soil, cracked soil, and the like), the disease severity (e.g., highly affected crop plant, medium affected and low or not affected crop plants). In addition, the variations in the collected data may also include the region (e.g., dry region, wet region, and the like), season (e.g., rainy season, rabi season, kharif season, and the like), and the type of crop plant (e.g., Cotton, Chili, Tomato, Brinjal, Castor, Lettuce, Potato, Cabbage, Cauliflower, and the like). An example of the data augmentation is described in detail in FIG. 3C. Furthermore, at operation 330, the one or more processors 126 are configured to generate the augmented set of color images 116, such as by using the plurality of image-level augmentation operations and the dataset-level augmentation operations. In an implementation, the augmented color images are generated through on-fly augmentation, such as at operation 332. Moreover, the on-fly augmentation refers to a real-time process of applying data augmentation operations on the acquired color input images during the training phase of the neural network model 124A. Therefore, instead of pre-generating the augmented color images and storing the generated augmented color images, the on-fly augmentation generates the augmented color images of the input data at any moment of time, during the training phase. Finally, at operation 334, the generated augmented color image data set that includes the plurality of generated augmented color images is used to train the neural network model 124A in order to identify the plurality of different types of crop plants.

Figure 3C:
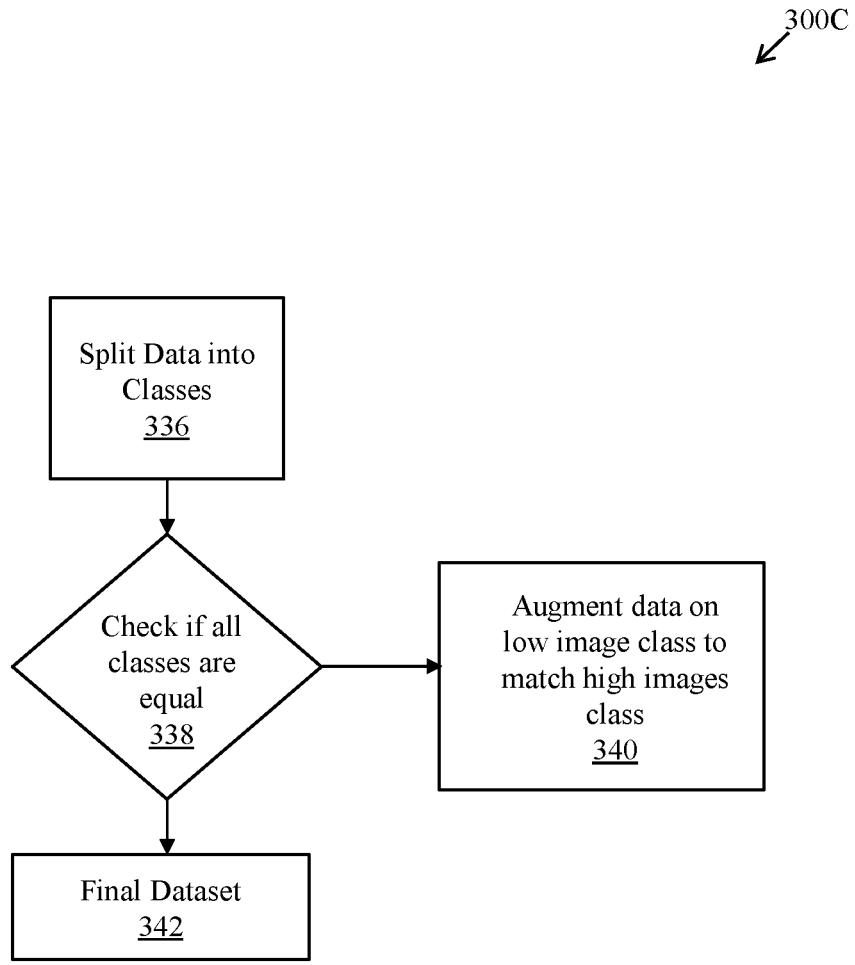
FIG. 3C is a diagram illustrating a flowchart for data balancing used for training of a neural network model for crop plants detection, in accordance with an embodiment of the present disclosure.

FIG. 3C is a diagram illustrating a flowchart for data balancing used for training of a neural network model for crop plants detection. FIG. 3C is described in conjunction with elements from FIGS. 1, 2A-2D, and 3A-3B. With reference to FIG. 3C, there is shown a flow chart 300C for data balancing. As shown in FIG. 3C, the flow chart 300C includes a series of operations 336 to 342.

At operation 336, the data is split into different classes, such as the age group (e.g., 10 days, 20 days, 30 days, and the like) of the crop plant, the time of capture (e.g., 8 AM to 10 AM, 10 AM to 12 PM, 12 PM to 2 PM, 2 PM to 4 PM, 4 PM to 6 PM, 6 PM to 8 PM, and the like), the lighting (e.g., bright light during sunny day, dull light during cloudy, the artificial light (during night time), and the like), the weed density (e.g., no weed, low weed, medium weed, and high weed), the soil conditions (e.g., wet soil, dry soil, cracked soil, and the like), the disease severity (e.g., highly affected crop plant, medium effected and low or not affected crop plants). In addition, the different classes may also include the region (e.g., dry region, wet region, and the like), season (e.g., rainy season, rabi season, kharif season, and the like), and the type of crop plant (e.g., Cotton, Chili, Tomato, Brinjal, Castor, Lettuce, Potato, Cabbage, Cauliflower, and the like).

At operation 338, the one or more processor 126 is configured to check if all the classes are equal or not. Moreover, if all the classes are equal, then, in that case, the operation 342 is executed and if all the classes are not equal, then, in that case, the operation 340 is executed. At operation 340, the one or more processor 126 is configured to augment the data on the low image category to match the high image category. Finally, at operation 342, a final dataset is generated that is further utilized to train the neural network model 124A.

Training Phase of the Neural Network Model 124A

Figure 3D:
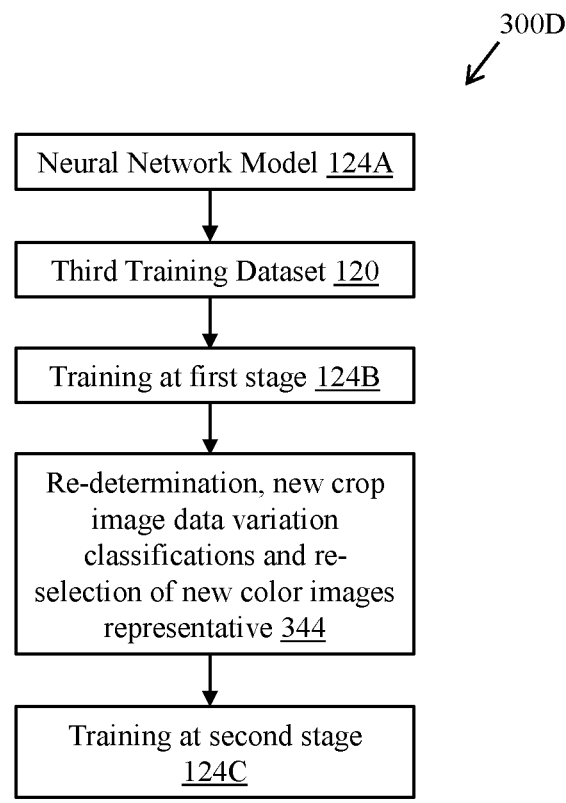
FIG. 3D is a diagram illustrating an exemplary scenario of training a neural network model to obtain a trained neural network model, in accordance with another embodiment of the present disclosure.

Now referring to FIG. 3D, there is shown an exemplary scenario 300D of training of neural network model 124A to obtain a trained neural network model, in accordance with another embodiment of the present disclosure.

In the training phase, the one or more processors 126 are configured to obtain the third training dataset 120. The third training dataset 120 used in the training phase may include thousands of different images of the agricultural field plant (e.g., images of the one or more foliage regions and the soil region) that are captured with a holistic view of the one or more foliage regions and the soil regions. In an implementation, the training dataset 360 includes input color images of the plants (indicating the one or more foliage regions and the soil region) captured in actual real-world conditions on the agricultural field. Furthermore, the training dataset further includes images that are captured at different times of day (e.g., early morning, evening, or night), and at different growth stages (e.g., two-day cotton plant, three-day cotton plant), different heath states (e.g., diseased and non-diseased, etc.), and under different surrounding environmental conditions, with variation in sunlight due to either clouds, rain, a shadow of a large object, like tree, while capturing an image, change in position of sun throughout the day, different light intensity when farming is done etc.), such as the input color images 112 that include different variations, such as the age group (e.g., 10 days, 20 days, 30 days, and the like) of the crop plant, the time of capture (e.g., 8 AM to 10 AM, 10 AM to 12 PM, 12 PM to 2 PM, 2 PM to 4 PM, 4 PM to 6 PM, 6 PM to 8 PM, and the like), the lighting (e.g., bright light during sunny day, dull light during cloudy, the artificial light (during night time), and the like), the weed density (e.g., no weed, low weed, medium weed, and high weed), the soil conditions (e.g., wet soil, dry soil, cracked soil, and the like), the disease severity (e.g., highly affected crop plant, medium effected and low or not affected crop plants). In addition, the different classes may also include the region (e.g., dry region, wet region, and the like), season (e.g., rainy season, rabi season, kharif season, and the like), and the type of crop plant (e.g., Cotton, Chili, Tomato, Brinjal, Castor, Lettuce, Potato, Cabbage, Cauliflower, and the like). Furthermore, the plurality of image-level augmentation operations, such as at operation 306, are applied to the acquired input color images.

Furthermore, the one or more processors 126 are configured to train the neural network model 124A in the first stage 124B on the third training dataset 120 comprising the noise-filtered images 128 from the second training dataset 114. Thereafter, at operation 344, the one or more processors 126 are configured to re-determine new crop image data variation classifications and re-select new color images representative of the new crop image data variation classifications. After that, the neural network model trained in the first stage 124B is further trained in the second stage 124C from the new color images representative of the new crop image data variation classifications to detect one or more crop plants.

Figure 4A:
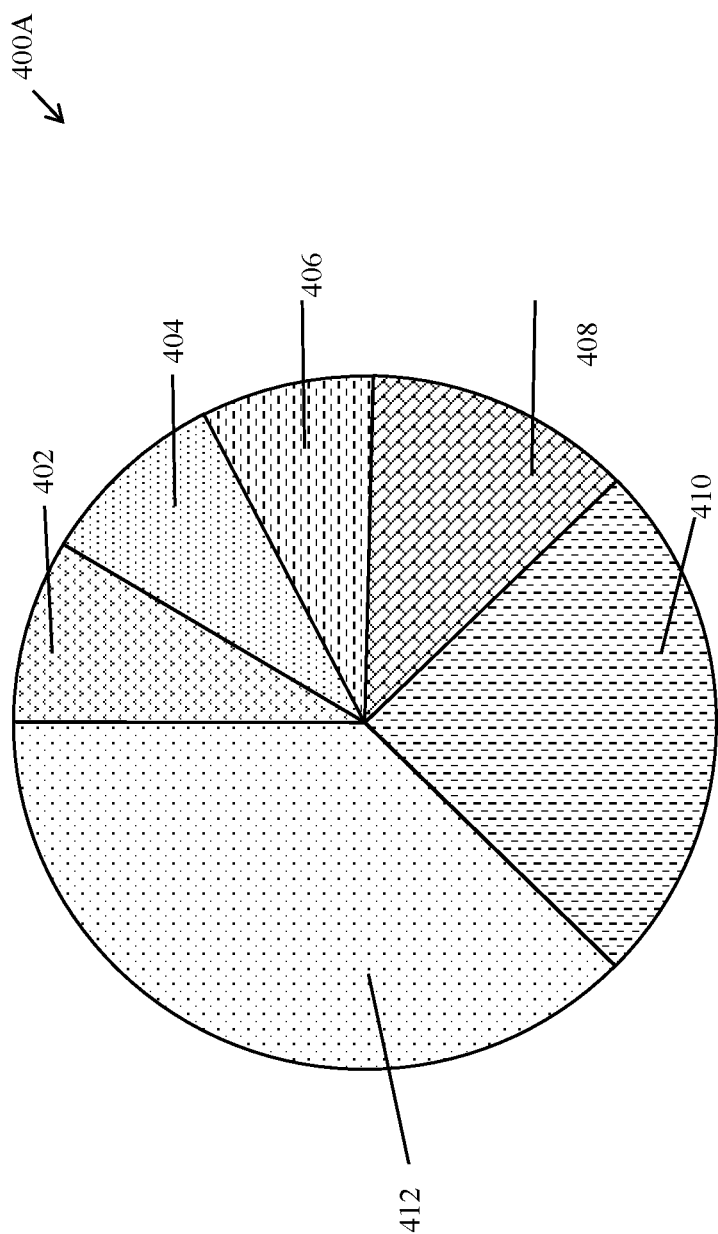
FIG. 4A is a diagram illustrating a graphical representation of a plurality of error types identified in a false negative class during evaluation of a trained neural network model in a first stage, in accordance with an embodiment of the present disclosure.

FIG. 4A is a diagram illustrating a graphical representation of a plurality of error types identified in a false negative class during evaluation of a trained neural network model in a first stage, in accordance with an embodiment of the present disclosure. With reference to FIG. 4A, there is shown a graphical representation 400A (i.e., a pie chart) that depicts false-negative class from the plurality of error types.

In an exemplary scenario, the graphical representation 400A represents six sectors, such as a first sector 402, a second sector 404, a third sector 406, a fourth sector 408, a fifth sector 410, and a sixth sector 412. Moreover, each sector of the graphical representation 400A represents a percentage of an error type that is included in the false negative class. In an implementation, the first sector 402 represents 8.8% of the diseased crop plants that are not detected. In another implementation, the second sector 404 represents 8.8% of the crop plants that are difficult to detect because corresponding crop plants are hidden or obscured by other objects. In yet another implementation, the third sector 406 represents 7.9% of the crop plants that are missed as the Intersection over Union (IoU) ratio is less than 0.5. IoU. Moreover, the IoU represents a bounding box that overlaps with the ground truth object. In another implementation, the fourth sector 408 represents 12.39% of the crop plants that are not detected due to low confidence level. In yet another implementation, the fifth sector 410 represents 24.6% of the crop plants that are not detected due to weed occlusion. In another implementation, the sixth sector 412 represents 37.7% of the crop plants that are not detected as the crop plants are too small (i.e., the size of the crop plant with respect to the overall area captured is less than the pre-defined threshold). Thus, each of the error types of the false negative class can be further used to re-train the neural network model in order to reduce such false detection in order to increase the accuracy of the neural network model for detecting the crop plants.

Figure 4B:
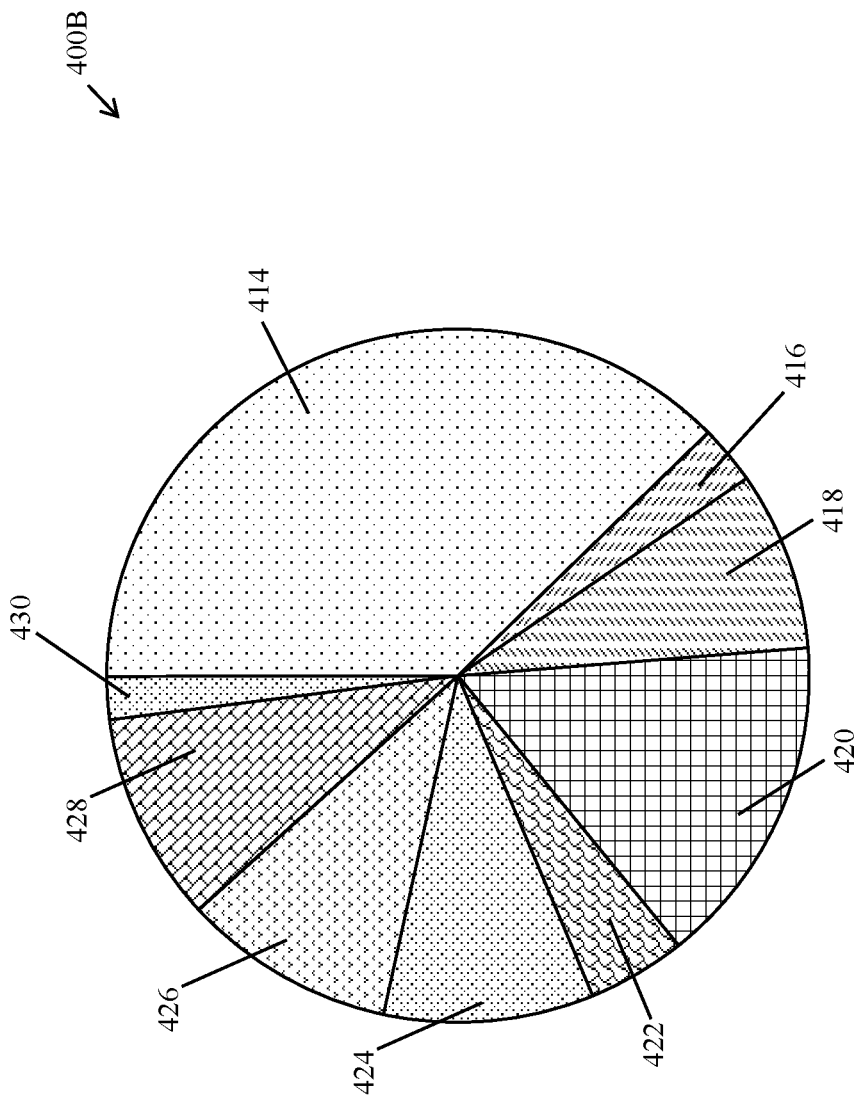
FIG. 4B is a diagram illustrating a graphical representation of a plurality of error types identified in a false positive class during evaluation of a trained neural network model in a first stage, in accordance with an embodiment of the present disclosure.

FIG. 4B is a diagram illustrating a graphical representation of a plurality of error types identified in a false positive class during evaluation of a trained neural network model in a first stage, in accordance with an embodiment of the present disclosure. With reference to FIG. 4B, there is shown a graphical representation 400B (i.e., a pie chart) that depicts false positive class from the plurality of error types.

In an exemplary scenario, the graphical representation 400B represents nine sectors, such as a first sector 414, a second sector 416, a third sector 418, a fourth sector 420, a fifth sector 422, a sixth sector 424, a seventh sector 426, an eighth sector 428, and a ninth sector 430. Moreover, each sector of the graphical representation 400B represents a percentage of an error type that is included in the false positive class. In an implementation, the first sector 414 represents 38.0% of the crop plants that are detected wrong due to broad leaves. In another implementation, the second sector 416 represents 2.1% of the crop plants that are detected wrong, for example, the cotton plants are detected as chilly plants. In yet another implementation, the third sector 418 represents 8.7% of the crop plants that are detected as a wrong diseased crop plant, for example, a healthy crop plant is detected as a diseased crop plant. In another implementation, the fourth sector 420 represents 19.4% of the crop plants that are detected wrong due to the shape of the leaf of the crop plant (e.g., heart-shaped leaf). In yet another implementation, the fifth sector 422 represents 3.7% of the crop plants that are detected wrong as the corresponding crop plants are hard to identify. In another implementation, the sixth sector 424 represents 7.4% of the crop plants that are detected wrong as the crop plants have narrow leaves. In yet another implementation, the seventh sector 426 represents 8.7% of the crop plants that are detected wrong due to certain other reasons. In another implementation, the eighth sector 428 represents 10.3% of the crop plants that are detected wrong due to partial visuals in the captured image. In yet another implementation, the ninth sector 430 represents 1.2% of the crop plants that are detected wrong due to occlusion by random objects. Thus, each of the error types of the false positive class can be further used to re-train the neural network model in order to reduce such false detection in order to increase the accuracy of the neural network model for detecting the crop plants.

Figure 5:
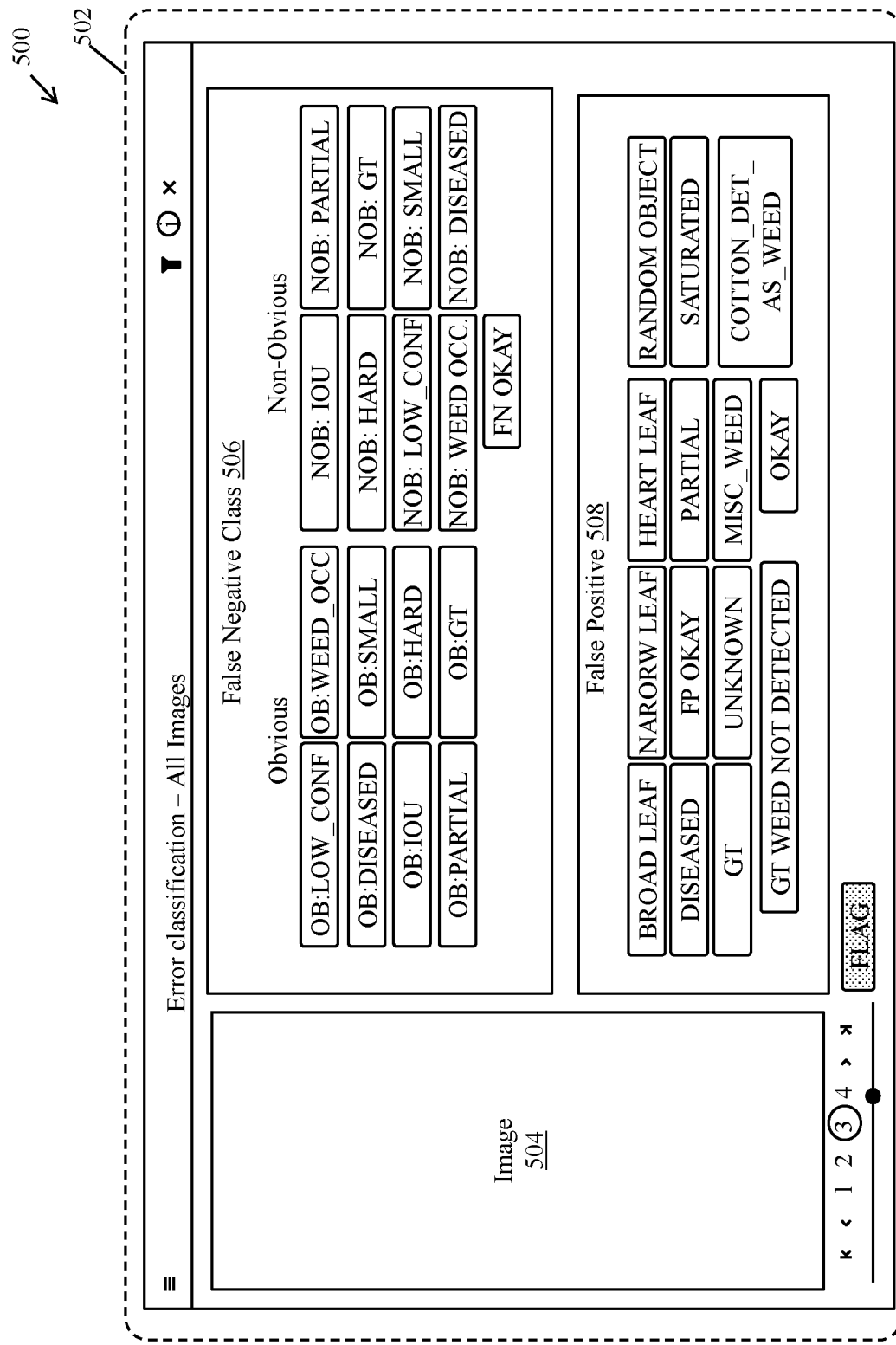
FIG. 5 is a diagram illustrating a user interface for error classification in images of agricultural field, in accordance with an embodiment of the present disclosure.

FIG. 5 is a diagram illustrating a user interface for error classification in images of agricultural field, in accordance with an embodiment of the present disclosure. FIG. 5 is described in conjunction with elements from FIGS. 1, 2A-2D, 3A-3D and 4A-4B. With reference to FIG. 5, there is shown a display device 500 having a user interface 502 for presenting visual information for an error classification in images (e.g., an image 504) of agricultural field, such as the false negative class and the false positive class. In an implementation, the one or more processors 126 (of FIG. 1) are communicatively coupled with the display device 500. The display device 500 includes any device that is capable of displaying information in a human-readable format, such as a computer monitor, a tablet, or a smartphone.

The user interface 502 displays the classification of the identified plurality of error types into a false negative class 506 and a false positive class 508, such as during the evaluation of the trained neural network model in order to determine the accuracy level of the trained neural network model. In an implementation, the user interface 502 displays the classification of the identified plurality of error types into the false negative class 506 and the false positive class 508 for the image 504 in which the crop plants are either not detected or mis detected by the neural network model 124A. For example, the false negative class 506 includes further sub-classes, such as obvious and non-obvious that represent the error types that are obvious (e.g., low_conf, diseased, IoU, partial, weed occlusion, too small plant, hard to detect crop pant image, and the like) to occur and the error types that are non-obvious to occur (e.g., low_conf, diseased, IoU, partial, weed occlusion, too small plant, hard to detect crop pant image, and the like). Similarly, the false positive class 508 represents the type of errors that lead to an incorrect detection of the crop plants (e.g., broad leaf, diseased, narrow leaf, heart leaf, random objects, partials, misdetection, and the like). Firstly, the one or more processors 126 are configured to identify the plurality of error types in the image 504, which is captured by the camera apparatus 102 in which one or more crop plants are not detected during the evaluation of the trained neural network model in the first stage 124B. Thereafter, the one or more processors 126 are configured to classify the identified plurality of error types into the false negative class 506 and the false positive class 508. After that, each error type of the identified plurality of error types is ranked in terms of the severity parameter, and the number of errors to prioritize the re-determination of the new crop image data variation classifications is performed. As a result, the user interface 502 can be used to evaluate the training of the neural network model 124A for the crop detection and further classify the type or errors in order to enable the trained neural network model to improve the accuracy for the crop detection and reduce the instances of false negative and false positive.

Figure 6:
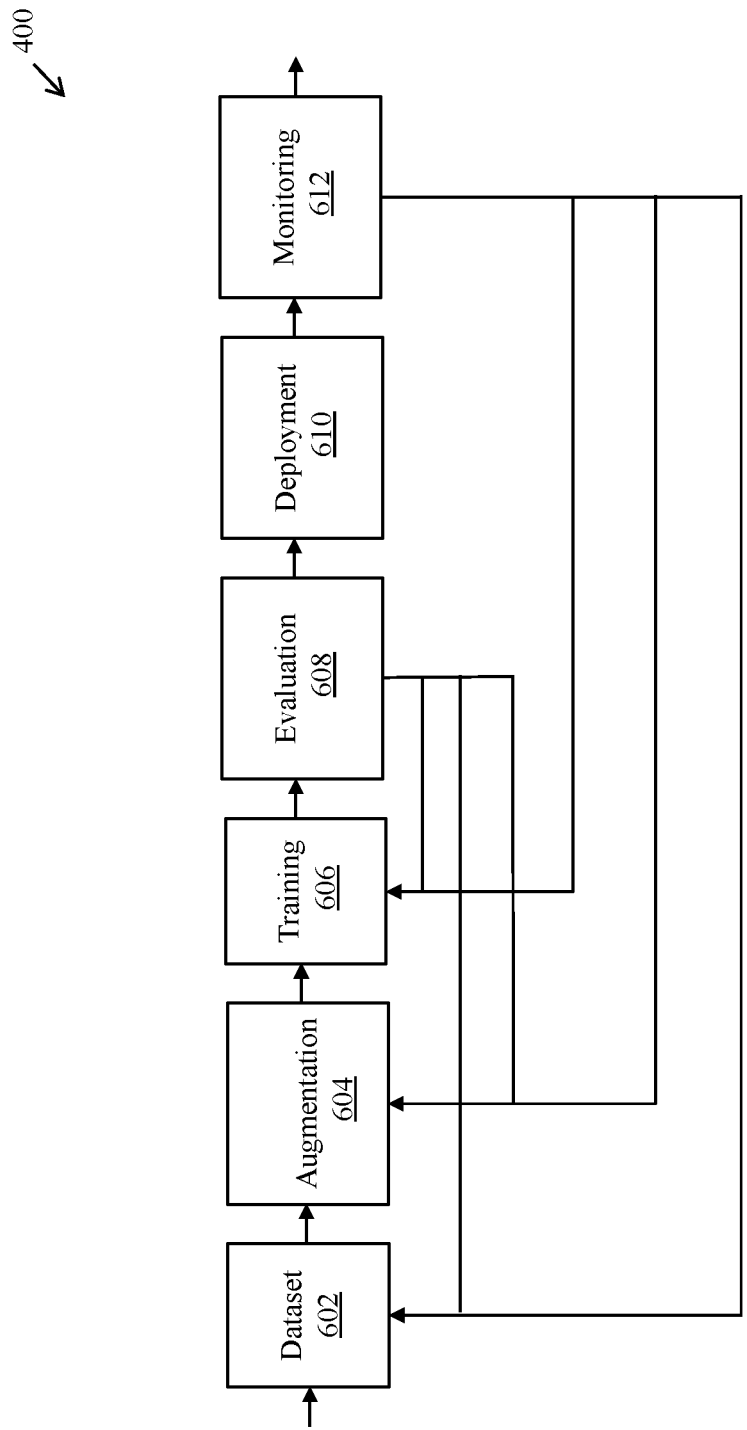
FIG. 6 is a diagram illustrating a training feedback and evolution of a neural network model for crop detection at different stages, in accordance with an embodiment of the present disclosure.

FIG. 6 is a diagram illustrating a training feedback and evolution of a neural network model for crop detection at different stages, in accordance with an embodiment of the present disclosure. FIG. 6 is described in conjunction with elements from FIGS. 1, 2A-2D, 3A-3D, 4A, 4B, and 5. With reference to FIG. 6, there is shown a flowchart 600 depicting the evolution of a neural network model for crop detection. The evolution of the neural network model 124A includes operations 602 to 610.

At operation 602, a dataset based on error classification is obtained. Moreover, the dataset further includes the plurality of crop image data variation classifications representative of real-world variations in the physical appearance of the crop plant as well as the surrounding area around the crop plant.

At operation 604, the plurality of different image level augmentation operations on the first set of input color images 112 to obtain an augmented set of color images 116 is executed in order to provide a balanced dataset for the training of the neural network model.

At operation 606, the one or more processors 126 are configured to perform the training of the neural network model 124A. In an implementation, one or more processors 126 are configured to train the neural network model in the first stage 124B on the third training dataset 120 comprising noise-filtered images 128 from the second training dataset 114. Furthermore, the new crop image data variation classifications are re-determined, and the new color images representative of the new crop image data variation classifications are re-selected to further train the neural network model in the second stage 124C from the new color images representative of the new crop image data variation classifications to detect one or more crop plants.

At operation 608, the neural network model is evaluated based on the detections of the crop plants and the surrounding area performed by the neural network model. Furthermore, based on the evaluation, which is performed at operation 608, the neural network model is trained at the second stage 124C and is deployed on the camera apparatus 102, such as at operation 610. Additionally, at operation 612, the deployed neural network model is monitored. Furthermore, new crop image data variation classifications are re-determined, and new color images representative of the new crop image data variation classifications are re-selected to further train the neural network model (i.e., in the second stage) from the new color images representative of the new crop image data variation classifications to detect one or more crop plants. As a result, the accuracy, and the reliability of the neural network model for crop detection enhances and reaches at 96% and above. Therefore, the evolution of the neural network model is used to handle different latest variations in the agricultural fields, such as the detection of the crop plants suffering from new types of diseases.

Figure 7A:
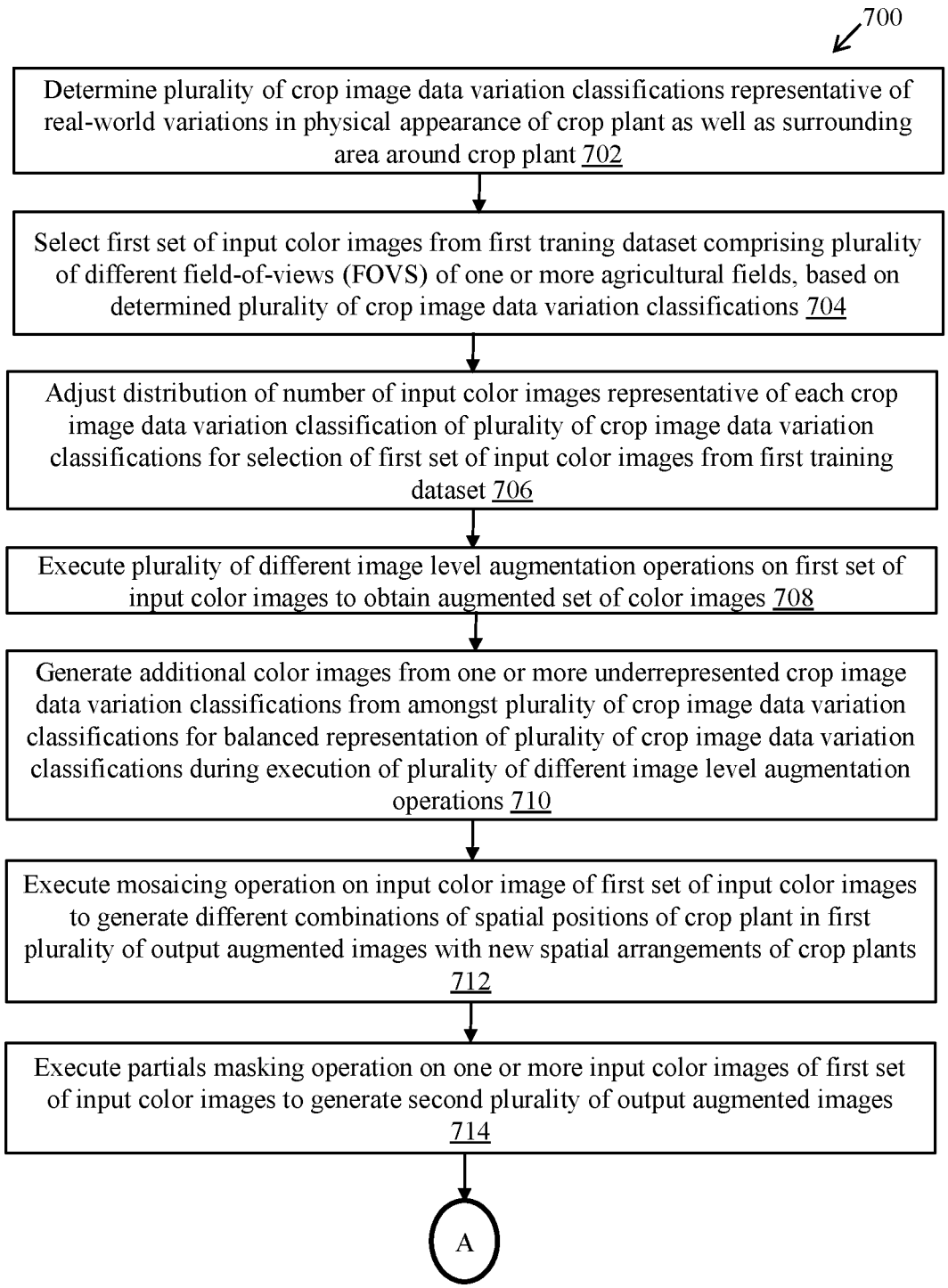
FIGS. 7A and 7B collectively is a diagram illustrating a flowchart of a method of detecting crop plants irrespective of crop image data variations, in accordance with an embodiment of the present disclosure.
Figure 7B:
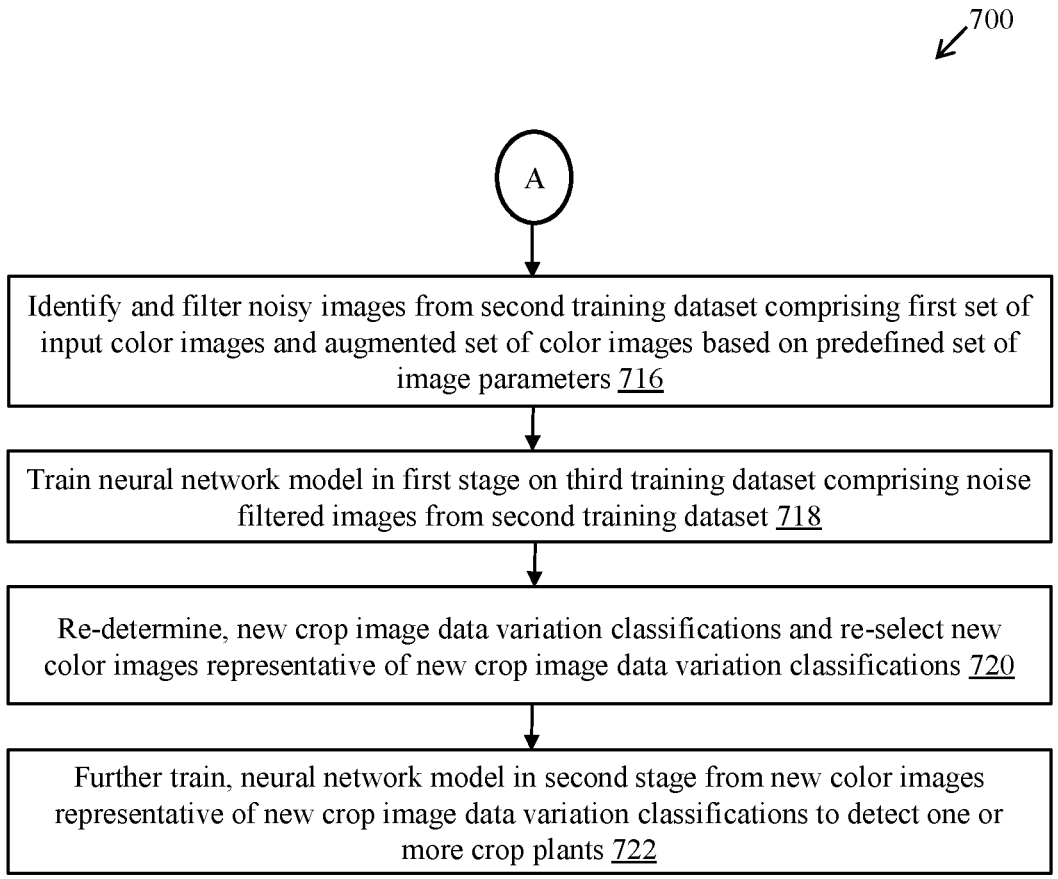

FIGS. 7A, and 7B collectively is a diagram illustrating a flowchart of a method of detecting crop plants irrespective of crop image data variations, in accordance with an embodiment of the present disclosure. FIGS. 7A and 7B are described in conjunction with elements from FIGS. 1, 2A-2D, 3A-3D, 4A, 4B, 5, and 6. With reference to FIGS. 7A and 7B, there is shown a method 700 that includes operations 702 to 724. In an implementation, the camera apparatus 102 (of FIG. 1) may be configured to execute the method 700. In another implementation, the training server 104 (of FIG. 1) may be configured to execute the method 700.

At 702, a plurality of crop image data variation classifications representative of real-world variations in the physical appearance of a crop plant as well as a surrounding area around the crop plant is determined by the one or more processors 126.

At 704, the first set of input color images 112 from the first training dataset 110 comprising a plurality of different field-of-views (FOVs) of one or more agricultural fields is selected by the one or more processors 126, based on the determined plurality of crop image data variation classifications.

At 706, a distribution of a number of input color images representative of each crop image data variation classification of the plurality of crop image data variation classifications is adjusted by the one or more processors 126 for the selection of the first set of input color images 112 from the first training dataset 110.

At 708, the plurality of different image level augmentation operations on the first set of input color images 112 to obtain the augmented set of color images 116 are executed by the one or more processors 126.

At 710, the additional color images from one or more underrepresented crop image data variation classifications are generated by the one or more processors 126 from amongst the plurality of crop image data variation classifications for a balanced representation of the plurality of crop image data variation classifications during the execution of the plurality of different image level augmentation operations.

At 712, a mosaicing operation is executed by the one or more processors 126 on an input color image of the first set of input color images to generate different combinations of spatial positions of the crop plant in a first plurality of output augmented images with new spatial arrangements of crop plants, and the mosaicing operation is one of the plurality of different image level augmentation operations.

At 714, a partials masking operation is executed by the one or more processors 126 on one or more input color images of the first set of input color images 112 to generate the second plurality of output augmented images, and in the partials masking operation, a partially visible crop plant region in the one or more input color images is masked with black pixels. Moreover, the partial masking operation is one of the plurality of different image-level augmentation operations.

At 716, noisy images 118 from the second training dataset 114 comprising the first set of input color images and the augmented set of color images 116 based on a predefined set of image parameters are identified and filtered by the one or more processors 126.

At 718, a neural network model 124A is trained by the one or more processors 126 in a first stage 124B on the third training dataset 120 comprising noise-filtered images 128 from the second training dataset 114.

At 720, new crop image data variation classifications are re-determined, and new color images representative of the new crop image data variation classifications are re-selected by one or more processors 126.

At 722, the neural network model in a second stage 124C from the new color images representative of the new crop image data variation classifications is further trained to detect one or more crop plants by the one or more processors 126. The trained neural network model is executed to detect one or more crop plants with higher accuracy and reliability in real time in operational phase as compared to conventional systems.

While various embodiments described in the present disclosure have been described above, it should be understood that they have been presented by way of example, and not limitation. It is to be understood that various changes in form and detail can be made therein without departing from the scope of the present disclosure. In addition to using hardware (e.g., within or coupled to a central processing unit ("CPU"), microprocessor, micro controller, digital signal processor, processor core, system on chip ("SOC"), or any other device), implementations may also be embodied in software (e.g. computer readable code, program code, and/or instructions disposed in any form, such as source, object or machine language) disposed for example in a non-transitory computer-readable medium configured to store the software. Such software can enable, for example, the function, fabrication, modeling, simulation, description, and/or testing of the apparatus and methods described herein. For example, this can be accomplished through the use of general program languages (e.g., C, C++), hardware description languages (HDL) including Verilog HDL, VHDL, and so on, or other available programs. Such software can be disposed of in any known non-transitory computer-readable medium, such as semiconductor, magnetic disc, or optical disc (e.g., CD-ROM, DVD-ROM, etc.). The software can also be disposed as computer data embodied in a non-transitory computer-readable transmission medium (e.g., solid state memory any other non-transitory medium including digital, optical, analog-based medium, such as removable storage media). Embodiments of the present disclosure may include methods of providing the apparatus described herein by providing software describing the apparatus and subsequently transmitting the software as a computer data signal over a communication network including the internet and intranets.

It is to be further understood that the system described herein may be included in a semiconductor intellectual property core, such as a microprocessor core (e.g., embodied in HDL) and transformed to hardware in the production of integrated circuits. Additionally, the system described herein may be embodied as a combination of hardware and software. Thus, the present disclosure should not be limited by any of the above-described exemplary embodiments but should be defined only in accordance with the following claims and their equivalents.

What is claimed is:

1. A camera apparatus, comprising:
one or more processors configured to:
determine a plurality of crop image data variation classifications representative of real-world variations in a physical appearance of a crop plant as well as a surrounding area around the crop plant;
select a first set of input color images from a first training dataset comprising a plurality of different field-of-views (FOVs) of one or more agricultural fields, based on the determined plurality of crop image data variation classifications;
execute a plurality of different image level augmentation operations on the first set of input color images to obtain an augmented set of color images;
identify and filter noisy images from a second training dataset comprising the first set of input color images and the augmented set of color images based on a predefined set of image parameters;
train a neural network model in a first stage on a third training dataset comprising noise filtered images from the second training dataset;
re-determine new crop image data variation classifications and re-select new color images representative of the new crop image data variation classifications; and
further train the neural network model in a second stage from the new color images representative of the new crop image data variation classifications to detect one or more crop plants.

2. The camera apparatus according to claim 1, wherein the plurality of crop image data variation classifications comprises an age group variation of crop plants and a different time-of-day of capture of color images.

3. The camera apparatus according to claim 2, wherein the plurality of crop image data variation classifications further comprises a lighting environment variation comprising capturing color images of the plurality of different FOVs in a sunny lighting condition, in a cloudy weather, and in an artificial lighting condition.

4. The camera apparatus according to claim 3, wherein the plurality of crop image data variation classifications further comprises a weed density variation and a soil type variation.

5. The camera apparatus according to claim 4, wherein the plurality of crop image data variation classifications further comprises a disease severity variation, a regional variation, a cropping seasons variation, and a crop type variation.

6. The camera apparatus according to claim 1, wherein one or more processors are further configured to adjust a distribution of a number of input color images representative of each crop image data variation classification of the plurality of crop image data variation classifications for the selection of the first set of input color images from the first training dataset.

7. The camera apparatus according to claim 1, wherein one or more processors are further configured to generate additional color images from one or more underrepresented crop image data variation classifications from amongst the plurality of crop image data variation classifications for a balanced representation of the plurality of crop image data variation classifications during the execution of the plurality of different image level augmentation operations.

8. The camera apparatus according to claim 1, wherein one or more processors are further configured to execute a mosaicking operation on an input color image of the first set of input color images to generate different combinations of spatial positions of the crop plant in a first plurality of output augmented images with new spatial arrangements of crop plants, and wherein the mosaicking operation is one of the plurality of different image level augmentation operations.

9. The camera apparatus according to claim 1, wherein one or more processors are further configured to execute a partials masking operation on one or more input color images of the first set of input color images to generate a second plurality of output augmented images, and wherein in the partials masking operation, a partially visible crop plant region in the one or more input color images is masked with black pixels, and wherein the partials masking operation is one of the plurality of different image level augmentation operations.

10. The camera apparatus according to claim 1, wherein one or more processors are further configured to execute a no-feature crop plant masking operation on one or more input color images of the first set of input color images to generate a third plurality of output augmented images, and wherein in the no-feature crop plant masking operation, a crop plant region in the one or more input color images is masked with black pixels when one or more criterions are met, and wherein the no-feature crop plant masking operation is one of the plurality of different image level augmentation operations.

11. The camera apparatus according to claim 10, wherein the one or more criterions to mask the crop plant region in the one or more input color images with black pixels in the no-feature crop plant masking operation is one or more of: a size of the crop plant region is less than a defined threshold, the crop plant region is blurred, an absence of color information in the crop plant region due to light reflection, a presence of an object occluding the crop plant region in a range of 30-100 percent.

12. The camera apparatus according to claim 1, wherein one or more processors are further configured to execute a selective soil augmentation operation on one or more input color images of the first set of input color images to generate a fourth plurality of output augmented images, and wherein in the selective soil augmentation operation, a Hue, Saturation, and Value (HSV) augmentation is exclusively applied to pixels corresponding to a soil region without affecting pixels of a crop plant region in each of the one or more input color images, and wherein the selective soil augmentation operation is one of the plurality of different image level augmentation operations.

13. The camera apparatus according to claim 1, wherein one or more processors are further configured to execute a shadow augmentation operation on one or more input color images of the first set of input color images to generate a fifth plurality of output augmented images, and wherein in the shadow augmentation operation, one or more shadows are randomly applied at different portions in the one or more input color images, and wherein the shadow augmentation operation is one of the plurality of different image level augmentation operations.

14. The camera apparatus according to claim 1, wherein one or more processors are further configured to execute a dataset level augmentation by adding in the first set of input color images, one or more secondary crop plant images as negative examples in addition to a primary crop plant that is to be detected.

15. The camera apparatus according to claim 1, wherein one or more processors are further configured to:
identifying a plurality of error types in a plurality of images in which one or more crop plants is not detected during evaluation of the trained neural network model in the first stage;
classifying the identified plurality of error types into a false negative class and a false positive class; and
rank each error type of the identified plurality of error types in terms of a severity parameter and a number of errors to prioritise the re-determination of the new crop image data variation classifications.

16. A method for detecting crop plants irrespective of crop image data variations, the method comprising:
determining, by one or more processors, a plurality of crop image data variation classifications representative of real-world variations in a physical appearance of a crop plant as well as a surrounding area around the crop plant;
selecting, by one or more processors, a first set of input color images from a first training dataset comprising a plurality of different field-of-views (FOVs) of one or more agricultural fields, based on the determined plurality of crop image data variation classifications;
executing, by one or more processors, a plurality of different image level augmentation operations on the first set of input color images to obtain an augmented set of color images;
identifying and filtering, by one or more processors, noisy images from a second training dataset comprising the first set of input color images and the augmented set of color images based on a predefined set of image parameters;
training, by one or more processors, a neural network model in a first stage on a third training dataset comprising noise filtered images from the second training dataset;
re-determining, by one or more processors, new crop image data variation classifications and re-select new color images representative of the new crop image data variation classifications; and further training, by one or more processors, the neural network model in a second stage from the new color images representative of the new crop image data variation classifications to detect one or more crop plants.

17. The method according to claim 16, further comprising adjusting, by one or more processors, a distribution of a number of input color images representative of each crop image data variation classification of the plurality of crop image data variation classifications for the selection of the first set of input color images from the first training dataset.

18. The method according to claim 16, further comprising generating, by one or more processors, additional color images from one or more underrepresented crop image data variation classifications from amongst the plurality of crop image data variation classifications for a balanced representation of the plurality of crop image data variation classifications during the execution of the plurality of different image level augmentation operations.

19. The method according to claim 16, further comprising executing, by one or more processors, a mosaicking operation on an input color image of the first set of input color images to generate different combinations of spatial positions of the crop plant in a first plurality of output augmented images with new spatial arrangements of crop plants, and wherein the mosaicking operation is one of the plurality of different image level augmentation operations.

20. The method according to claim 16, further comprising executing, by one or more processors, a partials masking operation on one or more input color images of the first set of input color images to generate a second plurality of output augmented images, and wherein in the partials masking operation, a partially visible crop plant region in the one or more input color images is masked with black pixels, and wherein the partials masking operation is one of the plurality of different image level augmentation operations.

* * * * *